United States Patent
Cheng et al.

(10) Patent No.: US 10,418,277 B2
(45) Date of Patent: *Sep. 17, 2019

(54) AIR GAP SPACER FORMATION FOR NANO-SCALE SEMICONDUCTOR DEVICES

(71) Applicant: International Business Machines Corporation, Armonk, NY (US)

(72) Inventors: Kangguo Cheng, Schenectady, NY (US); Thomas J. Haigh, Claverack, NY (US); Juntao Li, Cohoes, NY (US); Eric G. Liniger, Sandy Hook, CT (US); Sanjay C. Mehta, Niskayuna, NY (US); Son V. Nguyen, Schenectady, NY (US); Chanro Park, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/977,437

(22) Filed: May 11, 2018

(65) Prior Publication Data

US 2018/0261494 A1    Sep. 13, 2018

Related U.S. Application Data

(60) Continuation of application No. 15/789,416, filed on Oct. 20, 2017, which is a division of application No.
(Continued)

(51) Int. Cl.
*H01L 29/66* (2006.01)
*H01L 29/78* (2006.01)
(Continued)

(52) U.S. Cl.
CPC ...... *H01L 21/7682* (2013.01); *H01L 21/0217* (2013.01); *H01L 21/02126* (2013.01);
(Continued)

(58) Field of Classification Search
CPC .......... H01L 29/66795; H01L 29/4991; H01L 29/785; H01L 21/7682; H01L 21/02126;
(Continued)

(56) References Cited

U.S. PATENT DOCUMENTS

| 5,346,484 A | 9/1994 | Van Lindert |
|---|---|---|
| 5,736,446 A | 4/1998 | Wu |

(Continued)

FOREIGN PATENT DOCUMENTS

| CN | 1959976 A | 5/2007 |
|---|---|---|
| CN | 104916578 A | 9/2015 |
| WO | PCT/IB2017/054419 | 9/2017 |

OTHER PUBLICATIONS

Jemin Park, "Improving CMOS Speed and Switching Power with Air-Gap Structures," University of California at Berkeley, Electrical Engineering and Computer Sciences, Technical Report No. UCB/EECS-2011-84, http://www.eecs.berkeley.edu/Pubs/TechRpts/2011/EECS-2011-84.html, Jul. 21, 2011, 119 pages.
(Continued)

*Primary Examiner* — Michael M Trinh
(74) *Attorney, Agent, or Firm* — Vazken Alexanian; Ryan, Mason & Lewis, LLP

(57) ABSTRACT

Semiconductor devices having air gap spacers that are formed as part of BEOL or MOL layers of the semiconductor devices are provided, as well as methods for fabricating such air gap spacers. For example, a method comprises forming a first metallic structure and a second metallic structure on a substrate, wherein the first and second metallic structures are disposed adjacent to each other with insulating (Continued)

material disposed between the first and second metallic structures. The insulating material is etched to form a space between the first and second metallic structures. A layer of dielectric material is deposited over the first and second metallic structures using a pinch-off deposition process to form an air gap in the space between the first and second metallic structures, wherein a portion of the air gap extends above an upper surface of at least one of the first metallic structure and the second metallic structure.

20 Claims, 20 Drawing Sheets

Related U.S. Application Data

15/232,341, filed on Aug. 9, 2016, now Pat. No. 9,892,961.

(51) Int. Cl.
  H01L 21/768 (2006.01)
  H01L 21/02 (2006.01)
  H01L 23/528 (2006.01)
  H01L 23/532 (2006.01)
  H01L 29/417 (2006.01)
  H01L 29/49 (2006.01)

(52) U.S. Cl.
  CPC .. *H01L 21/02167* (2013.01); *H01L 21/02274* (2013.01); *H01L 21/76852* (2013.01); *H01L 23/528* (2013.01); *H01L 23/5329* (2013.01); *H01L 29/41775* (2013.01); *H01L 29/4991* (2013.01); *H01L 29/6653* (2013.01); *H01L 29/66795* (2013.01); *H01L 29/785* (2013.01)

(58) Field of Classification Search
  CPC ........... H01L 21/02167; H01L 21/0217; H01L 21/02274; H01L 21/76852; H01L 23/528; H01L 23/5222; H01L 23/5226; H01L 23/5329
  See application file for complete search history.

(56) References Cited

U.S. PATENT DOCUMENTS

| | | | |
|---|---|---|---|
| 5,914,519 A | 6/1999 | Chou et al. | |
| 6,346,484 B1 | 2/2002 | Cotte et al. | |
| 6,413,852 B1 | 7/2002 | Grill et al. | |
| 7,122,462 B2 | 10/2006 | Clevenger et al. | |
| 7,534,696 B2 | 5/2009 | Jahnes et al. | |
| 7,790,601 B1 | 9/2010 | Choi et al. | |
| 7,879,683 B2 | 2/2011 | Al-Bayati et al. | |
| 7,943,480 B2 | 5/2011 | Edelstein et al. | |
| 8,198,189 B2 | 6/2012 | Kim et al. | |
| 8,288,268 B2 * | 10/2012 | Edelstein | H01L 21/7682 438/619 |
| 8,637,384 B2 | 1/2014 | Ando et al. | |
| 8,637,930 B2 | 1/2014 | Ando et al. | |
| 8,735,279 B2 | 5/2014 | Horak et al. | |
| 8,828,862 B2 | 9/2014 | Horak et al. | |
| 8,941,157 B2 | 1/2015 | Kim et al. | |
| 8,952,452 B2 * | 2/2015 | Kang | H01L 29/78 257/346 |
| 9,105,693 B2 | 8/2015 | Edelstein et al. | |
| 9,263,391 B2 | 2/2016 | Nitta et al. | |
| 9,892,961 B1 * | 2/2018 | Cheng | H01L 21/0217 |
| 2007/0040239 A1 | 2/2007 | Chinthakindi et al. | |
| 2007/0218677 A1 * | 9/2007 | Engelhardt | H01L 21/7682 438/618 |
| 2007/0246804 A1 * | 10/2007 | Ohto | C23C 16/30 257/642 |
| 2011/0210448 A1 | 9/2011 | Nitta et al. | |
| 2011/0237075 A1 | 9/2011 | Nitta et al. | |
| 2013/0171817 A1 | 7/2013 | Cooney, III et al. | |
| 2014/0175659 A1 | 6/2014 | Lee et al. | |

OTHER PUBLICATIONS

List of IBM Patents or Patent Applications Treated as Related.

* cited by examiner

AIR GAP SPACER FORMATION FOR NANO-SCALE SEMICONDUCTOR DEVICES

TECHNICAL FIELD

The field relates generally semiconductor fabrication and, in particular, to techniques for fabricating air gap spacers for semiconductor devices.

BACKGROUND

As semiconductor manufacturing technology continues to evolve toward smaller design rules and higher integration densities, the separation between adjacent structures in integrated circuits becomes increasingly smaller. As such, unwanted capacitive coupling can occur between adjacent structures of integrated circuits such as adjacent metal lines in BEOL (back-end-of-line) interconnect structures, adjacent contacts (e.g., MOL (middle-of-the-line) device contacts) of FEOL (front-end-of-line) devices, etc. These structure-related parasitic capacitances can lead to degraded performance of semiconductor devices. For example, capacitive coupling between transistor contacts can lead to increased gate-to-source or gate-to-drain parasitic capacitances which adversely impact the operational speed of a transistor, increase the energy consumption of an integrated circuit, etc. In addition, unwanted capacitive coupling between adjacent metal lines of a BEOL structure can lead to increased resistance-capacitance delay (or latency), cross-talk, increased dynamic power dissipation in the interconnect stack, etc.

In an effort to reduce parasitic coupling between adjacent conductive structures, the semiconductor industry has adopted the use of low dielectric constant (low-k) dielectrics and ultra-low-k (ULK) dielectrics (in place of conventional $SiO_2$ (k=4.0)) as insulating materials for MOL and BEOL layers of ultra-large-scale integration (ULSI) integrated circuits. The advent of low-k dielectrics coupled with aggressive scaling, however, has led to critical challenges in the long-term reliability of such low-k materials. For example, low-k TDDB (time-dependent dielectric breakdown) is commonly considered a critical issue because low-k materials generally have weaker intrinsic breakdown strength than traditional $SiO_2$ dielectrics. In general, TDDB refers to the loss of the insulating properties of a dielectric when it is subjected to voltage/current bias and temperature stress over time. TDDB causes an increase in leakage current and, thus, degrades performance in nano-scale integrated circuits.

SUMMARY

Embodiments of the invention include semiconductor devices having air gap spacers that are formed as part of BEOL or MOL layers of the semiconductor devices, as well as methods for fabricating air gap spacers as part of BEOL and MOL layers of a semiconductor device.

For example, a method for fabricating a semiconductor device comprises forming a first metallic structure and a second metallic structure on a substrate, wherein the first and second metallic structures are disposed adjacent to each other with insulating material disposed between the first and second metallic structures. The insulating material is etched to form a space between the first and second metallic structures. A layer of dielectric material is deposited over the first and second metallic structures to form an air gap in the space between the first and second metallic structures, wherein a portion of the air gap extends above an upper surface of at least one of the first metallic structure and the second metallic structure.

In one embodiment, the first metallic structure comprises a first metal line formed in an interlevel dielectric layer of a BEOL interconnect structure, and the second metallic structure comprises a second metal line formed in the ILD layer of the BEOL interconnect structure.

In another embodiment, the first metallic structure comprises a device contact, and the second metallic structure comprises a gate structure of a transistor. In one embodiment, the device contact is taller than the gate structure, and the portion of the air gap extends above the gate structure and below an upper surface of the device contact.

Other embodiments will be described in the following detailed description of embodiments, which is to be read in conjunction with the accompanying figures.

BRIEF DESCRIPTION OF THE DRAWINGS

FIGS. 4 through 10 schematically illustrate a method for fabricating the semiconductor device of FIG. 1A, according to an embodiment of the invention, wherein:

FIG. 4 is cross-sectional schematic side view of the semiconductor device at an intermediate stage of fabrication in which a pattern of openings is formed in an ILD (interlayer dielectric) layer;

FIG. 5 is cross-sectional schematic side view of the semiconductor device of FIG. 4 after depositing a conformal layer of liner material and depositing a layer of metallic material to fill the openings in the ILD layer;

FIG. 6 is cross-sectional schematic side view of the semiconductor device of FIG. 5 after planarizing the surface of the semiconductor structure down to the ILD layer to form a metal wiring layer;

FIG. 7 is cross-sectional schematic side view of the semiconductor device of FIG. 6 after forming protective caps on metal lines of the metal wiring layer;

FIG. 8 is cross-sectional schematic side view of the semiconductor device of FIG. 7 after etching the ILD layer to form spaces between the metal lines of the metal wiring layer;

FIG. 9 is a cross-sectional schematic side view of the semiconductor device of FIG. 8 after depositing a conformal layer of insulating material to form an insulating liner that covers exposed surfaces of the metal wiring layer and ILD layer; and FIG. 10 is a cross-sectional schematic side view of the semiconductor device of FIG. 9 which illustrates a process of depositing a dielectric material using a non-conformal deposition process to cause pinch-off regions to begin forming in the deposited dielectric material over the spaces between the metal lines of the metal wiring layer.

FIGS. 12 through 19 schematically illustrate a method for fabricating the semiconductor device of FIG. 11, according to an embodiment of the invention, wherein:

FIG. 12 is cross-sectional schematic view of the semiconductor device at an intermediate stage of fabrication in which vertical transistor structures are formed on a semiconductor substrate;

FIG. 13 is cross-sectional schematic side view of the semiconductor device of FIG. 12 after patterning a pre-metal dielectric layer to form contact openings between gate structures of the vertical transistor structures;

FIG. 14 is cross-sectional schematic side view of the semiconductor device of FIG. 13 after forming a conformal liner layer over the surface of the semiconductor device to line the contact openings with a liner material;

FIG. 15 is a cross-sectional schematic side view of the semiconductor device of FIG. 14, after depositing a layer of metallic material to fill the contact openings with metallic material and planarizing the surface of the semiconductor device to form MOL device contacts;

FIG. 16 is a cross-sectional side view of the semiconductor device of FIG. 15 after recessing gate capping layers and sidewall spacers of the gate structures of the vertical transistor structures;

FIG. 17 is a cross-sectional schematic side view of the semiconductor device of FIG. 16 after depositing a conformal layer of insulating material to form an insulating liner that lines the exposed surfaces of the gate structures and MOL device contacts;

FIG. 18 is a cross-sectional schematic side view of the semiconductor device of FIG. 17 after depositing a dielectric material using a non-conformal deposition process to cause pinch-off regions that form air gaps in spaces between the gate structures and MOL device contacts; and FIG. 19 is a cross-sectional schematic side view of the semiconductor device of FIG. 18 after planarizing the surface of the semiconductor device down to the MOL device contacts and depositing an ILD layer as part of a first interconnect level of a BEOL structure.

DETAILED DESCRIPTION

Embodiments will now be described in further detail with regard to semiconductor integrated circuit devices having air gap spacers that are formed as part of BEOL and/or MOL layers, as well as methods for fabricating air gap spacers as part of BEOL and/or MOL layers of a semiconductor integrated circuit device. In particular, as explained in further detail below, embodiments of the invention include methods for fabricating air gap spacers using "pinch-off" deposition techniques which utilize certain dielectric materials and deposition techniques to control the size and shape of the air gap spacers that are formed and, thereby, optimize air gap spacer formation for a target application. The exemplary pinch-off deposition methods as discussed herein to form air gap spacers provide improved TDDB reliability as well as optimal capacitance reduction in BEOL and MOL layers of semiconductor integrated circuit devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1A:
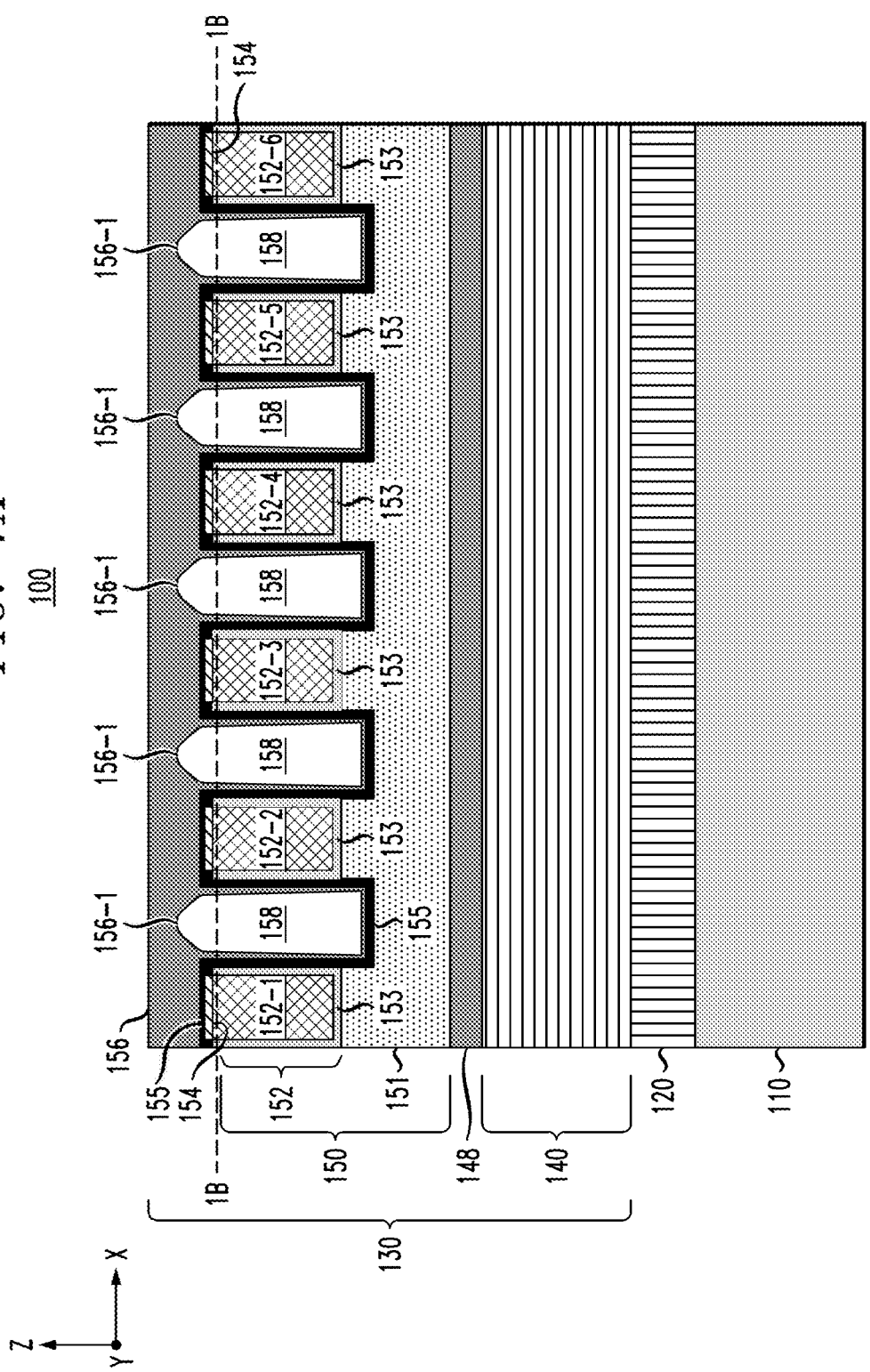
FIGS. 1A and 1B are schematic views of a semiconductor device comprising air gap spacers that are integrally formed within a BEOL structure of the semiconductor device, according to an embodiment of the invention.
Figure 1B:
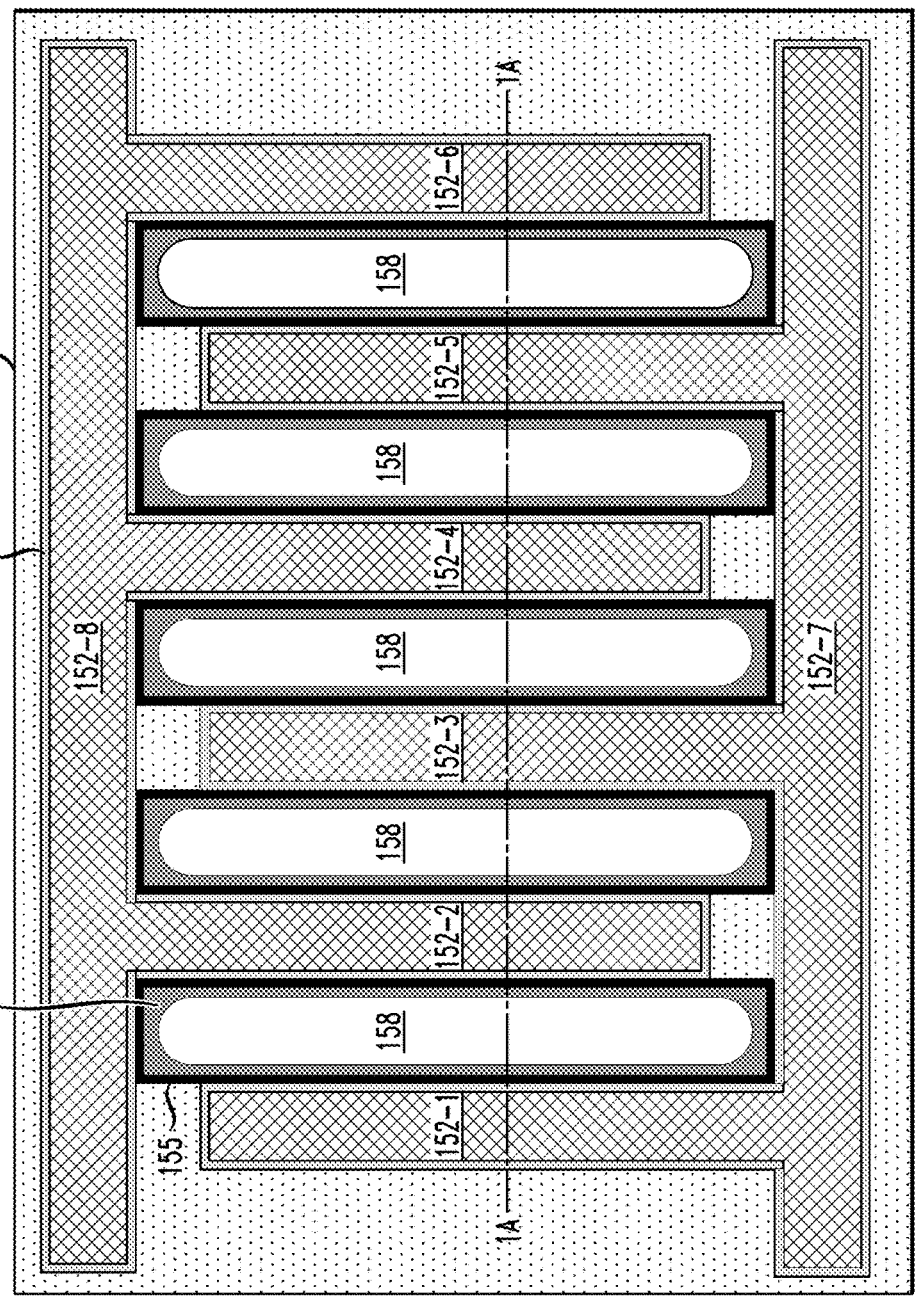

FIGS. 1A and 1B are schematic views of a semiconductor device 100 comprising air gap spacers that are integrally formed within a BEOL structure of the semiconductor device, according to an embodiment of the invention. FIG. 1A is a schematic cross-sectional side view of the semiconductor device 100 taken along line 1A-1A in FIG. 1B, and FIG. 1B is a schematic plan view of the semiconductor device 100 along a plane that includes line 1B-1B as shown in FIG. 1A. More specifically, FIG. 1A is a schematic cross-sectional side view of the semiconductor device 100 in an X-Z plane, and FIG. 1B is a plan view showing a layout of various elements within an X-Y plane, as indicated by the respective XYZ Cartesian coordinates shown in FIGS. 1A and 1B. It is to be understood that the term "vertical" or "vertical direction" as used herein denotes a Z-direction of the Cartesian coordinates shown in the figures, and the term "horizontal" or "horizontal direction" as used herein denotes an X-direction and/or Y-direction of the Cartesian coordinates shown in the figures.

In particular, FIG. 1A schematically illustrates the semiconductor device 100 comprising a substrate 110, a FEOL/MOL structure 120, and a BEOL structure 130. In one embodiment, the substrate 110 comprises a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. The thickness of the base substrate 100 will vary depending on the application. In another embodiment, the substrate 110 comprises a SOI (silicon on insulator) substrate, which comprises an insulating layer (e.g., oxide layer) disposed between a base semiconductor substrate (e.g., silicon substrate) and an active semiconductor layer (e.g., active silicon layer) in which active circuit components (e.g., field effect transistors) are formed as part of a FEOL layer.

In particular, the FEOL/MOL structure 120 comprises a FEOL layer formed on the substrate 110. The FEOL layer comprises various semiconductor devices and components that are formed in or on the active surface of the semiconductor substrate 110 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 110. In general, FEOL processes typically include preparing the substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of the BEOL structure 130.

The BEOL structure 130 is formed on the FEOL/MOL structure 120 to connect the various integrated circuit components of the FEOL layer. As is known in the art, a BEOL structure comprises multiple levels dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the example embodiment of FIG. 1A, the BEOL structure 130 comprises a first interconnect level 140, and a second interconnect level 150. The first interconnect level 140 is generically depicted, and can include one more low-k inter-level dielectric (ILD) layers and metallic via and wiring levels (e.g., copper damascene structures). A capping layer 148 is formed between the first interconnect level 140 and the second interconnect level 150. The capping layer 148 serves to insulate metallization of the first interconnect level 140 from the dielectric material of the ILD layer 151. For example, the capping layer 148 serves to improve interconnect reliability and prevent copper metallization from diffusing into the ILD layer 151 of the second interconnect level 150. The capping layer 148 may include any suitable insulating or dielectric material including, but not limited to, silicon nitride (SiN), silicon carbide (SiC), silicon carbon nitride (SiCN), hydrogenated silicon carbide (SiCH), a multilayer stack comprising the same or different types of dielectric materials, etc. The capping layer 148 can be deposited using standard deposition techniques, for example, chemical vapor deposition. The capping layer 148 can be formed with a thickness in a range from about 2 nm to about 60 nm.

The second interconnect level 150 comprises an ILD layer 151 and a metal wiring layer 152 formed in the ILD layer 151. The ILD layer 151 can be formed using any suitable dielectric material including, but not limited to, silicon oxide (e.g. SiO2), SiN (e.g., (Si3N4), hydrogenated silicon carbon oxide (SiCOH), silicon based low-k dielectrics, porous dielectrics, or other known ULK (ultra-low-k) dielectric materials. The ILD layer 151 can be deposited using known deposition techniques, such as, for example, ALD (atomic layer deposition), CVD (chemical vapor deposition) PECVD (plasma-enhanced CVD), or PVD (physical vapor deposition). The thickness of the ILD layer 151 will vary depending on the application, and may have a thickness in a range of about 30 nm to about 200 nm, for example.

The metal wiring layer 152 comprises a plurality of closely spaced metal lines 152-1, 152-2, 152-3, 152-4, 152-5, and 152-6, which are formed within trenches/openings that are patterned in the ILD layer 151 and filled with metallic material to form the metal lines. The trenches/openings are lined with a conformal liner layer 153 which serves as a barrier diffusion layer to prevent migration of the metallic material (e.g., Cu) into the ILD layer 151, as well as an adhesion layer to provide good adhesion to the metallic material (e.g., Cu) that is used to fill the trenches/openings in the ILD layer 151 and form the metal lines 152-1, . . . , 152-6.

As further depicted in FIG. 1A, the second interconnect level 150 further comprises protective caps 154 that are selectively formed on an upper surface of the metal lines 152-1, 152-2, 152-3, 152-4, 152-5, and 152-6, a conformal insulating liner 155 that conformally covers the metal wiring layer 152, and a dielectric capping layer 156 that is deposited using a pinch-off deposition technique to form air gap spacers 158 between the metal lines 152-1, 152-2, 152-3, 152-4, 152-5, and 152-6. The protective caps 154 and conformal insulating liner 155 serve to protect the metal wiring 152 from potential structural damage or contamination which can result from subsequent processing steps and environmental conditions. Example materials and methods for forming the protective caps 154 and the conformal insulating liner 155 will be discussed in further detail below with reference to FIGS. 7-9.

The air gap spacers 158 are formed in spaces between the metal lines 152-1, 152-2, 152-3, 152-4, 152-5, and 152-6 of the metal wiring layer 152 as a means to decrease the parasitic capacitive coupling between adjacent metal lines of the metal wiring layer 152. As explained in further detail below, a dielectric air gap integration process is performed as part of the BEOL fabrication process in which portions of the dielectric material of the ILD layer 151 are etched away to form spaces between the metal lines metal lines 152-1, 152-2, 152-3, 152-4, 152-5, and 152-6 of the wiring layer 152. The dielectric capping layer 156 is formed using a non-conformal deposition process (e.g., chemical vapor deposition) to deposit a dielectric material which forms "pinch-off" regions 156-1 above the upper portions of the spaces between the metal lines of the wiring layer 152, thereby forming the air gap spacers 158. As shown in FIG. 1A, in one embodiment of the invention, the pinch-off regions 156-1 are formed above the upper surfaces of the metal lines 152-1, . . . , 152-6 of the metal wiring layer 152, as indicated by the dashed line 1B-1B. In this regard, the air gap spacers 158 that are formed between the metal lines 152-1, . . . , 152-6 vertically extend into the dielectric capping layer 156 above the metal lines 152-1, . . . , 152-6.

Furthermore, in one embodiment of the invention, as shown in FIG. 1B, the air gap spacers 158 formed between the metal lines 152-1, . . . , 152-6 horizontally extend (e.g., in the Y-direction) past end portions of adjacent metal lines. In particular, FIG. 1B shows an example interdigitated comb-comb layout pattern of the metal wiring layer 152 wherein the metal lines 152-1, 152-3, and 152-5 are commonly connected at one end to an elongated metal line 152-7, and wherein the metal lines 152-2, 152-4, and 152-6 are connected at one end to an elongated metal line 152-8. As shown in FIG. 1B, the air gap spacers 158 horizontally extend past the open (unconnected) ends of the metal lines 152-1, . . . , 152-6. As compared to conventional air gap structures, the size and shape of the air gap spacers 158 shown in FIGS. 1A and 1B provide improved TDDB reliability, as well as reduced capacitive coupling between the metal lines, for reasons that will now be discussed in further detail with reference to FIGS. 2A and 2B.

Figure 2A:
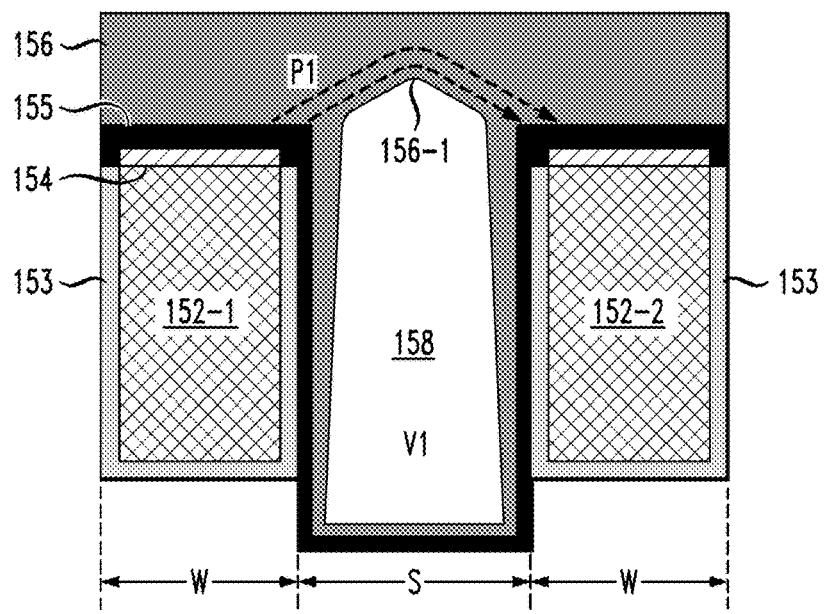
FIGS. 2A and 2B schematically illustrate improvements in TDDB reliability and reduced capacitive coupling between metal lines of a BEOL structure, which are realized using air gap structures that are formed using pinch-off deposition methods according to embodiments of the invention, as compared to air gap structures that are formed using conventional methods.
Figure 2B:
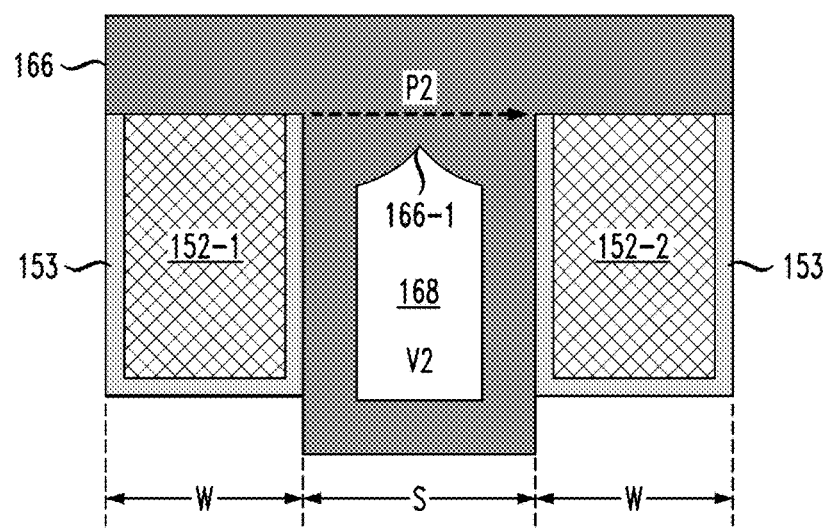

FIGS. 2A and 2B schematically illustrate improvements in TDDB reliability and reduced capacitive coupling between metal lines of a BEOL structure, which are realized using air gap structures that are formed using pinch-off deposition methods according to embodiments of the invention, as compared to air gap structures that are formed using conventional methods. In particular, FIG. 2A schematically illustrates a portion of the metal wiring layer 152 of FIG. 1A including the metal lines 152-1 and 152-2, and the air gap 158 which is formed between the metal lines by forming the dielectric capping layer 156 using a pinch-off deposition process according to an embodiment of the invention. As depicted in FIG. 2A, the metal lines 152-1 and 152-2 and associated liners 153 are formed to have a width W, and are spaced apart by a distance S. Further, FIG. 2B schematically illustrates a semiconductor structure comprising an air gap 168 that is disposed between the same two metal lines 152-1 and 152-2 having the same width W and spacing S as in FIG. 2A, but wherein the air gap 168 is formed by forming a dielectric capping layer 166 using a conventional pinch-off deposition process.

As shown in FIG. 2A, the "pinch-off" region 156-1 is formed in the dielectric capping layer 156 such that the air gap 158 extends above the upper surface of the metal lines 152-1 and 152-2. In contrast, as shown in FIG. 2B, a conventional pinch-off deposition process results in the formation of a pinch-off region 166-1 in the dielectric capping layer 166 below the upper surface of the metal lines 152-1 and 152-2 such that the resulting air gap 168 does not extend above the metal lines 152-1 and 152-2. Furthermore, as comparatively illustrated in FIGS. 2A and 2B, the amount of dielectric material that is deposited on the sidewall and bottom surfaces in the space between the metal lines 152-1 and 152-2 as shown in FIG. 2B using a conventional pinch-off deposition process is significantly greater than the amount of dielectric material that is deposited on the sidewall and bottom surfaces in the space between the metal lines 152-1 and 152-2 as shown in FIG. 2A using a pinch-off deposition process according to an embodiment of the invention. As a result, a volume V1 of the resulting air gap 158 in FIG. 2A is significantly greater than a volume V2 of the resulting air gap 168 shown in FIG. 2B.

There are various advantages associated with the structure in FIG. 2A as compared to the conventional structure shown in FIG. 2B. For example, the larger volume V1 of the air gap 158 (with less dielectric material disposed in the space between the metal lines) results in a smaller parasitic capacitance between the metal lines metal lines 152-1 and 152-2 (as compared to the structure of FIG. 2B). Indeed, there is a reduced effective dielectric constant in the space between metal lines 152-1 and 152-2 in FIG. 2A as compared to FIG. 2B since there is less dielectric material and a large volume V1 of air (k=1) in the space between the metal lines 152-1 and 152-2 of FIG. 2A.

In addition, the structure of FIG. 2A provides improved TDDB reliability as compared to the structure of FIG. 2B. In particular, as shown in FIG. 2A, since the air gap 158 extends above the metal lines 152-1 and 152-2, there is a long diffusion/conducting path P1 between the critical interfaces of the metal lines 152-1 and 152-2 (the critical interfaces being an interface between the dielectric capping layer 156 and the upper surfaces of the metal lines 152-1 and 152-2). This is in contrast to a shorter diffusion/conducting path P2 in the dielectric capping layer 166 between the critical interfaces of the metal lines 152-1 and 152-2 in the structure shown in FIG. 2B. A TDDB failure mechanism in the structure of FIG. 2A or 2B would result from the breakdown of the dielectric material and the formation of a conducting path through the dielectric material between the upper surfaces of the metal lines 152-1 and 152-2 due to electron tunneling current. The longer diffusion path P1 in the structure shown in FIG. 2A, coupled with the optional use of a dense dielectric liner 155 material with superior dielectric breakdown strength, would provide improved TDDB reliability of the structure in FIG. 2A as compared to the structure shown in FIG. 2B.

Furthermore, the horizontal extension of the air gap spacers 158 past the end portions of the metal lines as shown in FIG. 1B would further add to an improvement in TDDB reliability and reduced capacitive coupling for the same reasons discussed with reference to FIG. 2A. In particular, as shown in FIG. 1B, the extension of the air gap 158 past the end of the metal line 152-1, for example, would provide a long diffusion/conducting path between the critical interface at the open end of the metal line 152-1 and the adjacent metal line 152-2. In an alternate embodiment of FIG. 1B, air gap spacers could be formed between the elongated metal line 152-8 and the adjacent open ends of the metal lines 152-1, 152-2 and 152-5, and air gap spacers could be formed between the elongated metal line 152-7 and the adjacent open ends of the metal lines 152-2, 152-4, and 152-6, to thereby further optimize TDDB reliability and reduce capacitive coupling between the interdigitated comb structures.

Figure 3:
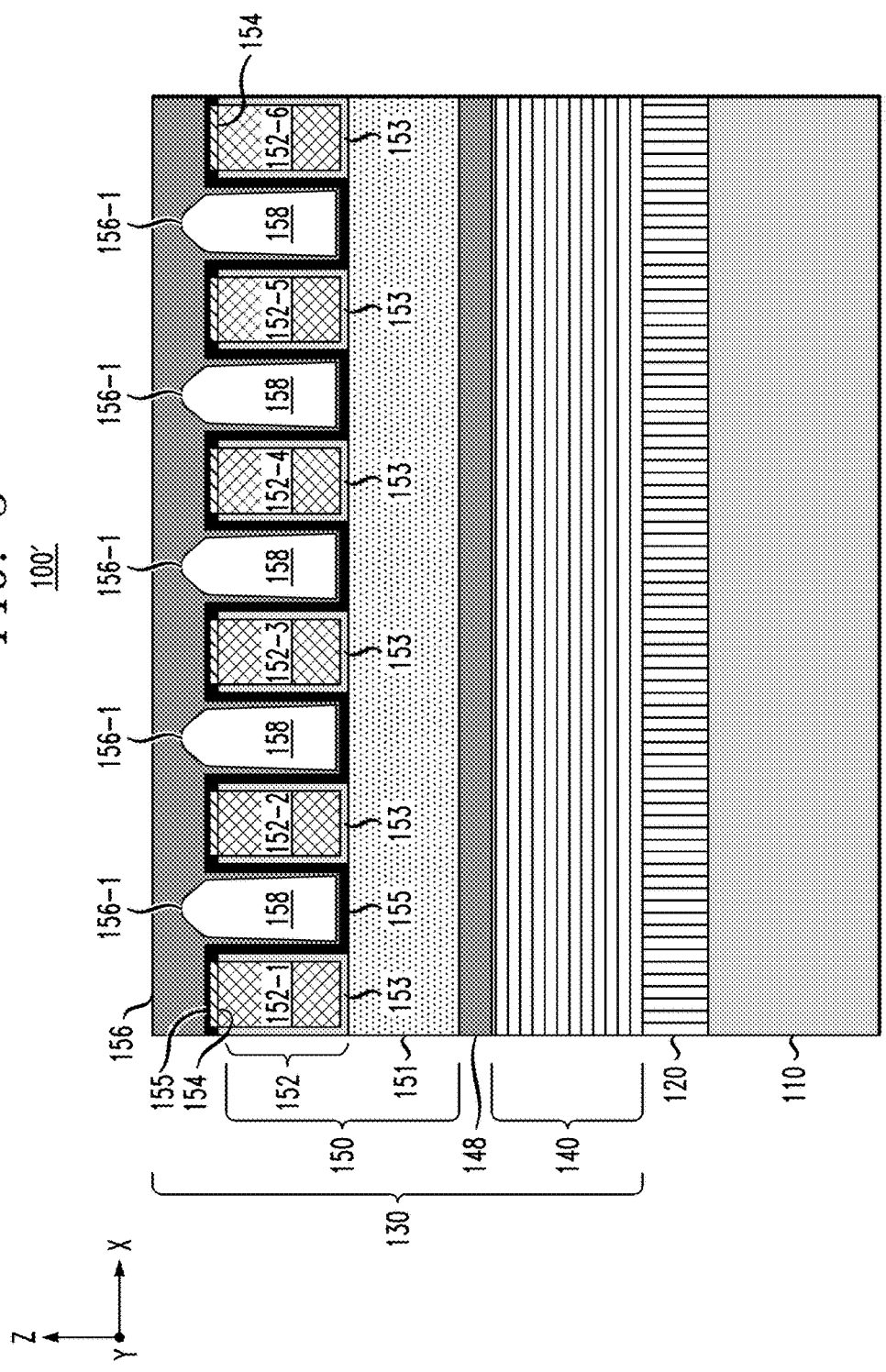
FIG. 3 is a cross-sectional schematic side view of a semiconductor device comprising air gap spacers that are integrally formed within a BEOL structure of the semiconductor device, according to another embodiment of the invention.
Figure 8:
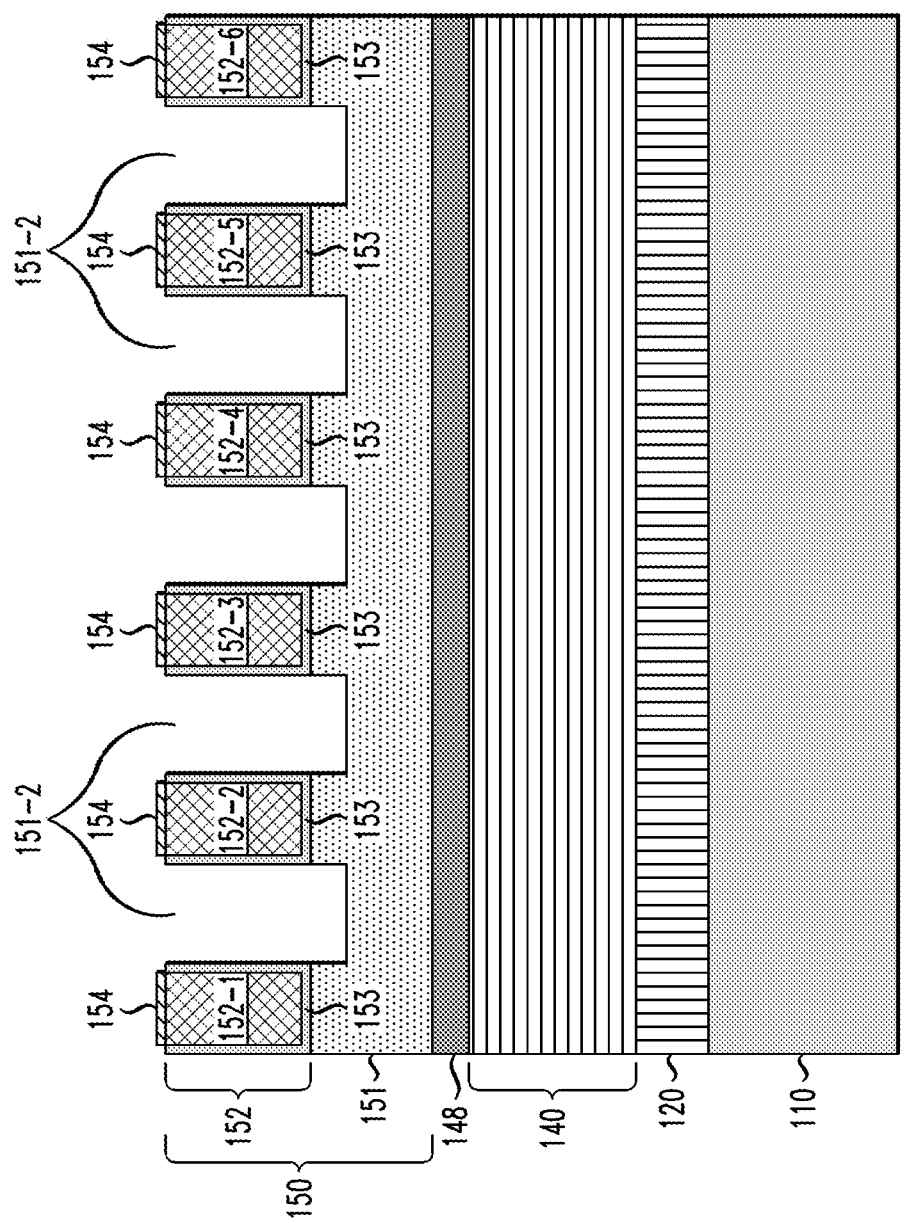

FIG. 3 is a cross-sectional schematic side view of a semiconductor device comprising air gap spacers that are integrally formed within a BEOL structure of the semiconductor device, according to another embodiment of the invention. In particular, FIG. 3 schematically illustrates a semiconductor device 100' which is similar in structure to the semiconductor device 100 shown in FIGS. 1A/1B, except that the air gap spacers 158 shown in FIG. 3 do not extend past a bottom surface of the metal lines of the metal wiring layer 152. With this structure, the ILD layer 151 would be recessed down to the bottom level of the metal lines (as compared to being recessed below the bottom of the metal lines, as shown in FIG. 8, to form the extended air gap spacers shown in FIG. 1A.) In other embodiments of the invention, while FIGS. 1A and 3 show the BEOL structure 130 having first and second interconnect levels 140 and 150, the BEOL structure 130 can have one or more additional interconnect levels formed over the second interconnect level 150. Such additional interconnect levels can be formed with air gap spacers using techniques and materials as discussed herein.

Figure 4:
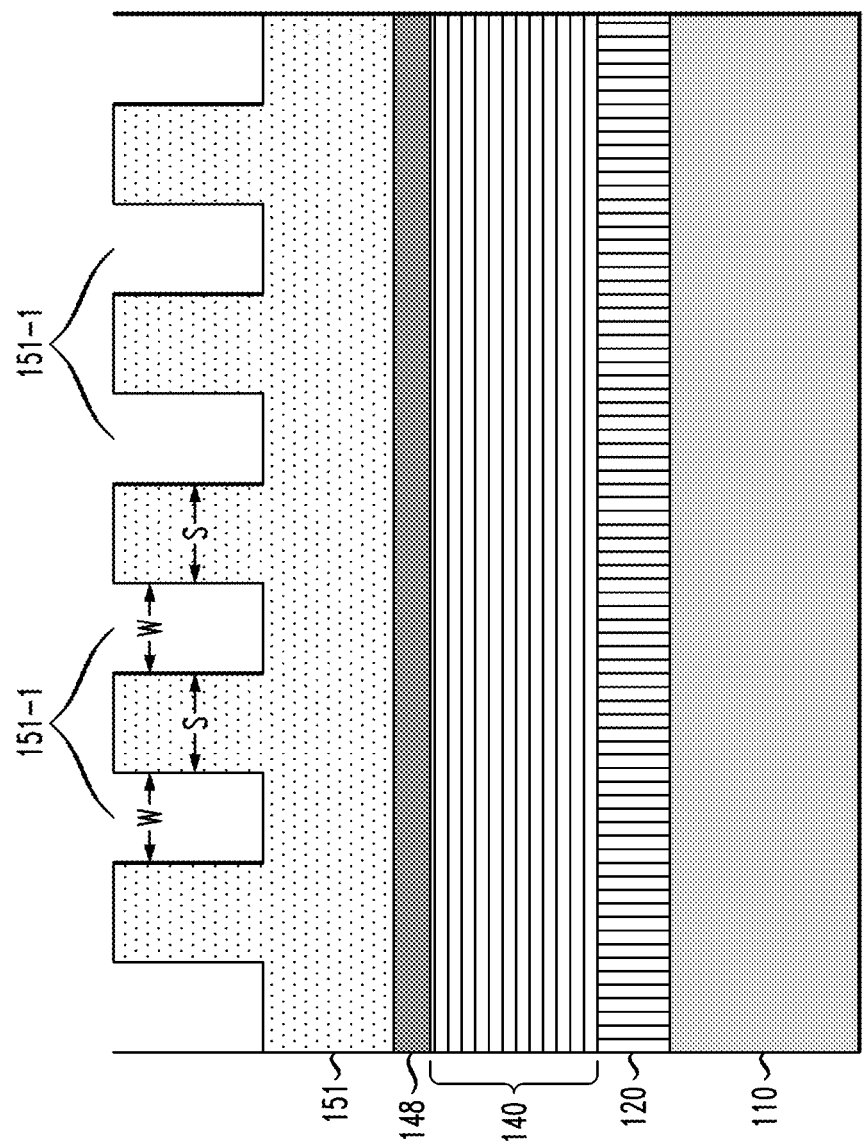

Methods for fabricating the semiconductor device 100 of FIG. 1A (and FIG. 3) will now be discussed in further detail with reference to FIGS. 4 through 10, which schematically illustrate the semiconductor device 100 at various stages of fabrication. For example, FIG. 4 is cross-sectional schematic view of the semiconductor device 100 at an intermediate stage of fabrication in which a pattern of openings 151-1 (e.g., damascene openings comprising trenches and via openings) are formed in the ILD layer 151, according to an embodiment of the invention. In particular, FIG. 4 schematically illustrates the semiconductor device 100 of FIG. 1A at an intermediate stage of fabrication after sequentially forming the FEOL/MOL structure 120, the first interconnect level 140, the capping layer 148, and the ILD layer 151 on top of substrate 110, and after patterning the ILD layer 151 to form the openings 151-1 in the ILD layer 151. After depositing the ILD layer 151, standard photolithography and etch processes can be performed to etch the openings 151-1 in the ILD layer 151, which are subsequently filled with metallic material to form the metal wiring layer 152 of FIG. 1A. It is to be noted that while no vertical vias are shown in the ILD layer 151, it is to be understood that vertical vias would exist in the second interconnect level 150 to provide vertical connections to metallization in the underlying interconnect level 140.

In FIG. 4, the openings 151-1 are shown to have a width W and spaced apart by a distance S. In one embodiment of the invention, in the context of forming air gap spacers between closely-spaced metal lines using pinch-off deposition methods, the width W of the openings (in which the metal lines are formed) can be in a range of about 2 nm to about 25 nm with a preferred range of about 6 nm to about 10 nm. Furthermore, in one embodiment, the spacing S between the metal lines can be in a range of about 2 nm to about 25 nm with a preferred range from about 6 nm to about 10 nm.

Figure 5:
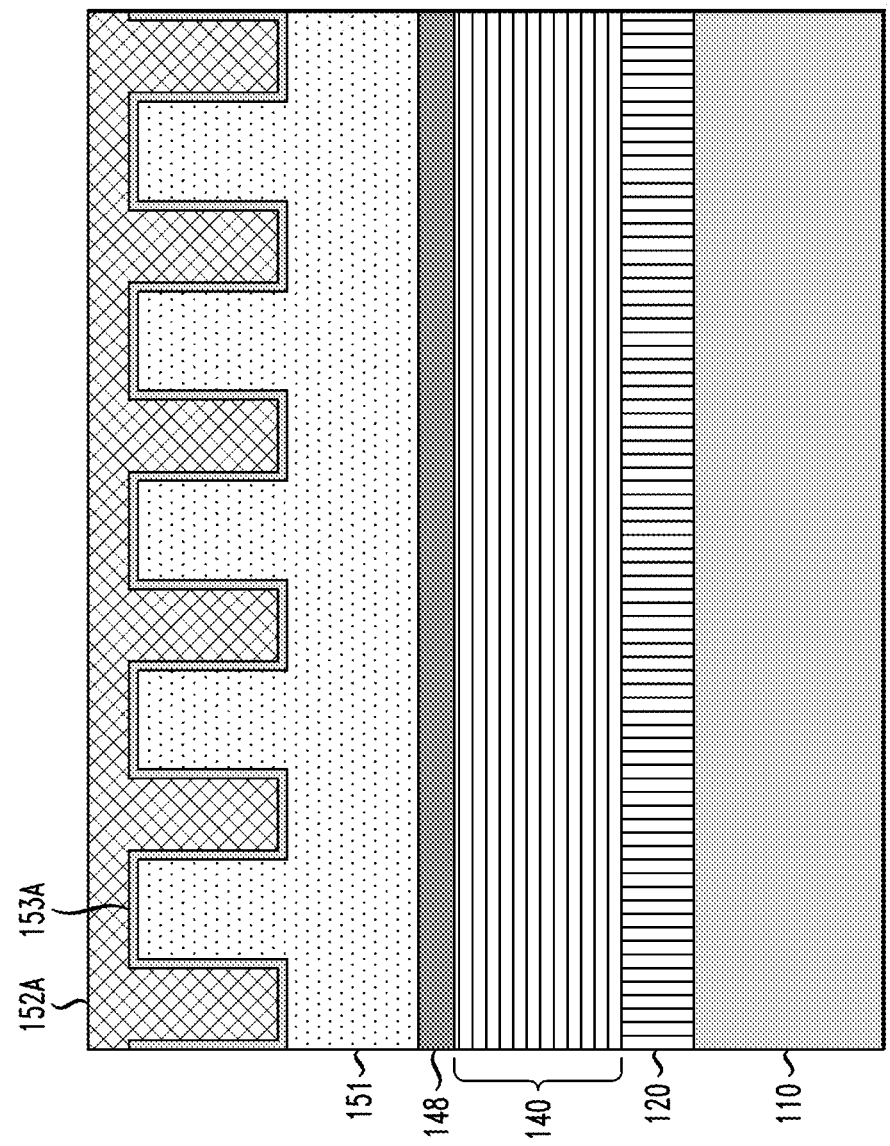
Figure 6:
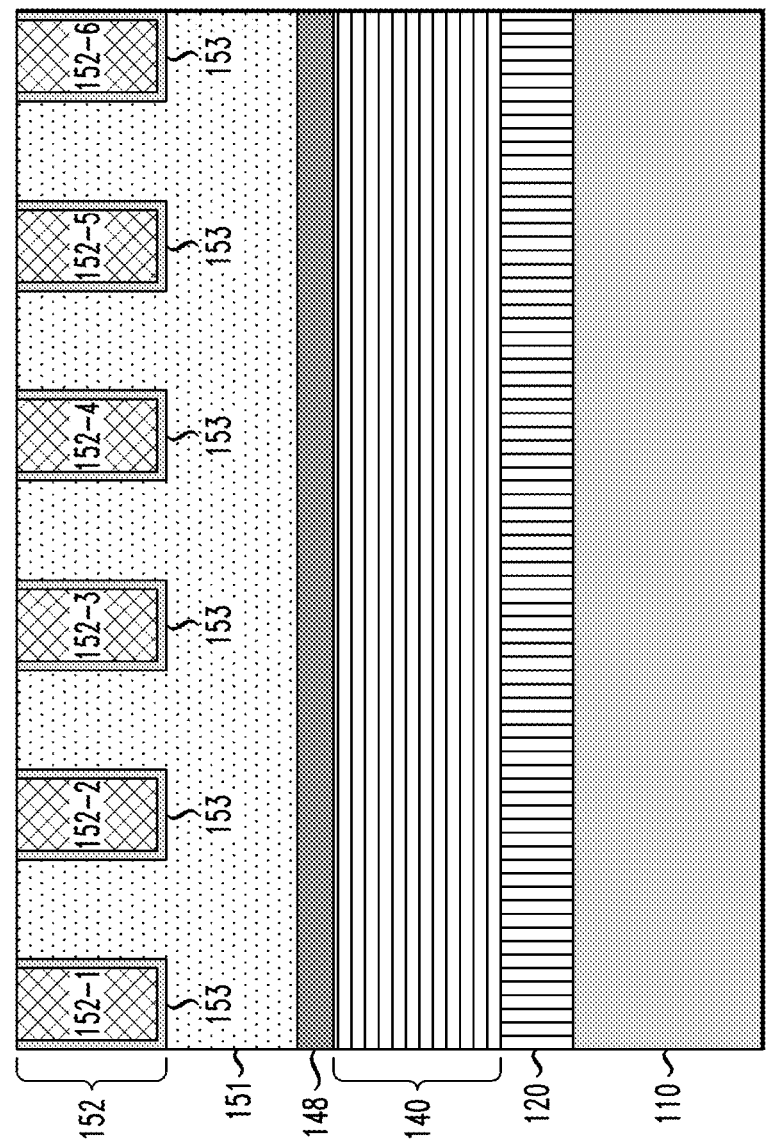

A next process module in the exemplary fabrication process comprises forming the metal wiring layer 152 shown in FIG. 1A using a process flow as schematically illustrated in FIGS. 5 and 6. In particular, FIG. 5 is cross-sectional schematic view of the semiconductor device of FIG. 4 after depositing a conformal layer of liner material 153A and depositing a layer of metallic material 152A on the conformal layer of liner material 153A to fill the openings 151-1 in the ILD layer 151. In addition, FIG. 6 is cross-sectional schematic view of the semiconductor device of FIG. 5 after planarizing the surface of the semiconductor structure down to the ILD layer 151 to form the metal wiring layer 152. The metal wiring layer 152 can be formed using known materials and known techniques.

For example, the conformal layer of liner material 153A is preferably deposited to line the sidewall and bottom surfaces of the openings 151-1 in the ILD layer 151 with a thin liner layer. The thin liner layer may be formed by conformally depositing one or more thin layers of material such as, for example, tantalum nitride (TaN), cobalt (Co), or ruthenium (Ru), or manganese (Mn) or manganese nitride (MnN) or other liner materials (or combinations of liner materials such as Ta/TaN, TiN, CoWP, NiMoP, NiMoB) which are suitable for the given application. The thin liner layer serves multiple purposes. For example, the thin liner layer serves as a barrier diffusion layer to prevent migration/diffusion of the metallic material (e.g., Cu) into the ILD layer 151. In addition, the thin liner layer serves as an adhesion layer to provide good adhesion to the layer of metallic material 152A (e.g., Cu) that is used to fill the openings 151-1 in the ILD layer 151.

In one embodiment, the layer of metallic material 152A comprises a metallic material such as, for example, copper (Cu), aluminum (Al), tungsten (W), cobalt (Co), or ruthenium (Ru), which is deposited using known techniques such as electroplating, electroless plating, CVD, PVD, or a combination of methods. Prior to filling the openings 151-1 in the ILD layer 151 with the conductive material, a thin seed layer (e.g., Cu seed layer) may optionally be deposited (on the conformal liner layer 153A) using a suitable deposition technique such as ALD, CVD or PVD. The seed layer can be formed of a material which enhances adhesion of the metallic material on the underlying material and which serves as catalytic material during a subsequent plating process. For example, a thin conformal Cu seed layer can be deposited over the surface of the substrate using PVD, followed by the electroplating of Cu to fill the openings 151-1 (e.g., trenches and vias) formed in the ILD layer 151 and, thus, form a Cu metallization layer 152. The overburden liner, seed, and metallization materials are then removed by performing a chemical mechanical polishing process (CMP) to planarize the surface of the semiconductor structure down to the ILD layer 151, resulting in the intermediate structure shown in FIG. 6.

Figure 7:
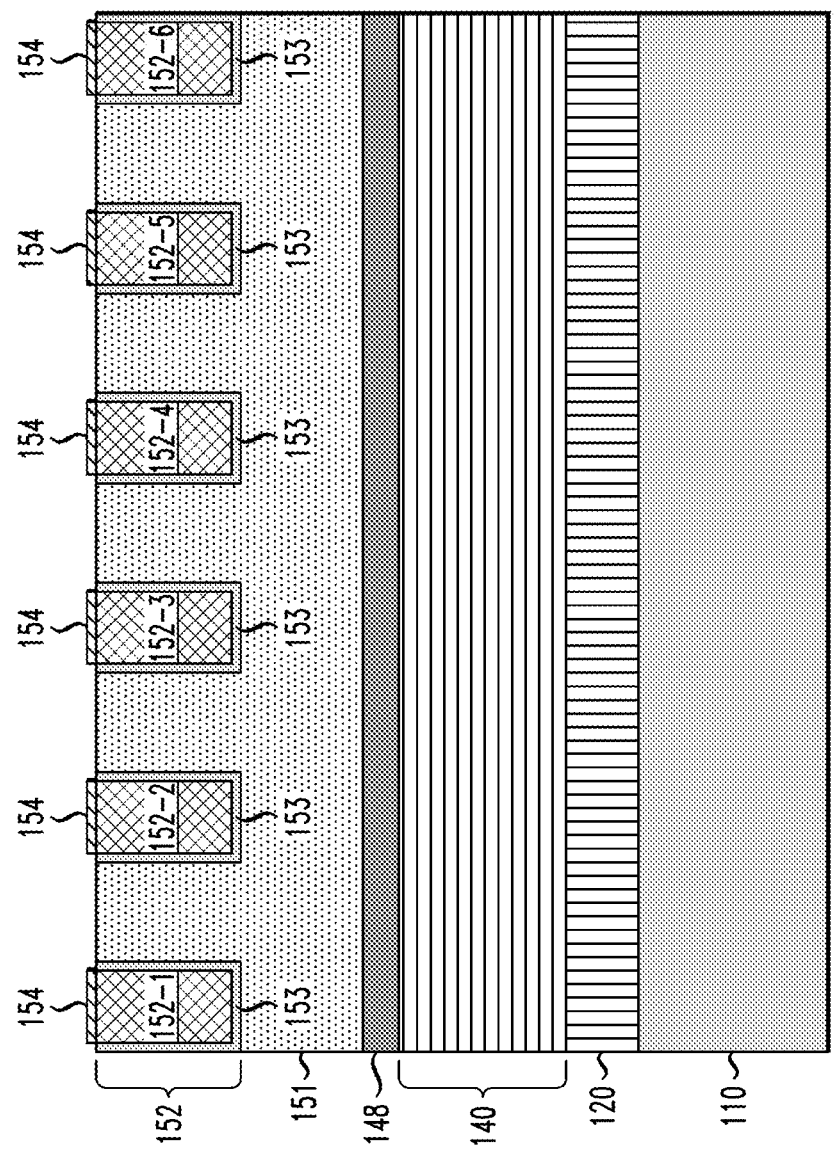

In one embodiment of the invention, after performing the CMP process, a protective layer may be formed on the exposed surfaces of the metal lines 152-1, . . . , 152-6 to protect the metallization from potential damage as a result of subsequent processing conditions and environments. For example, FIG. 7 is cross-sectional schematic view of the semiconductor device of FIG. 6 after forming protective caps 154 on the metal lines 152-1, . . . , 152-6, according to an embodiment of the invention. In one embodiment, for copper metallization, the protective caps 154 may be formed using a selective Co deposition process to selectively deposit a thin capping layer of Co on the exposed surfaces of the metal lines 152-1, . . . , 152-6. In other embodiments of the invention, the protective caps 154 can be formed of other materials such as tantalum (Ta) or ruthenium (Ru). The protective caps 154 on the metal lines 152-1, . . . , 152-6 are optional features that can be utilized, if desired, to allow for more aggressive etching conditions, etc., when forming air gap spacers and other structures using techniques discussed hereafter.

Figure 9:
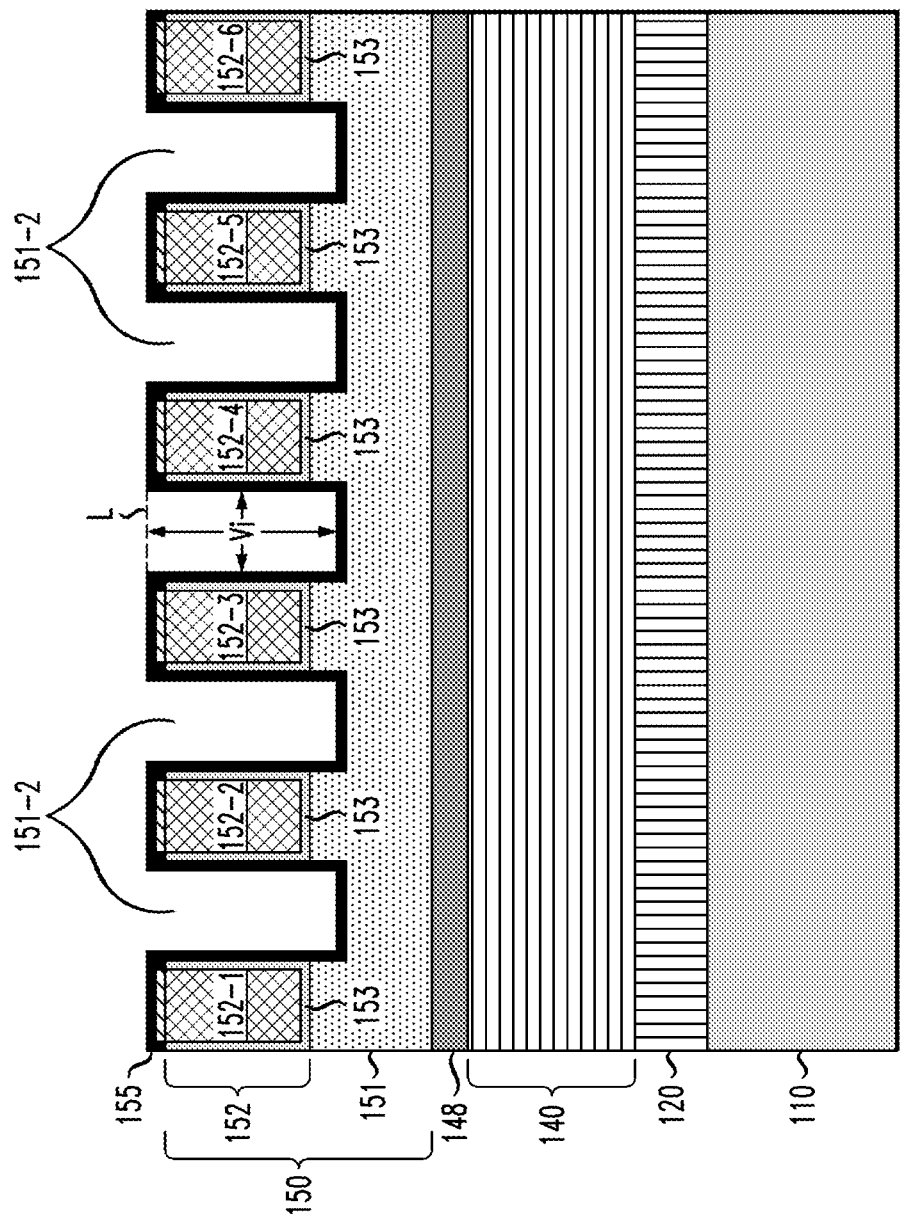
Figure 10:
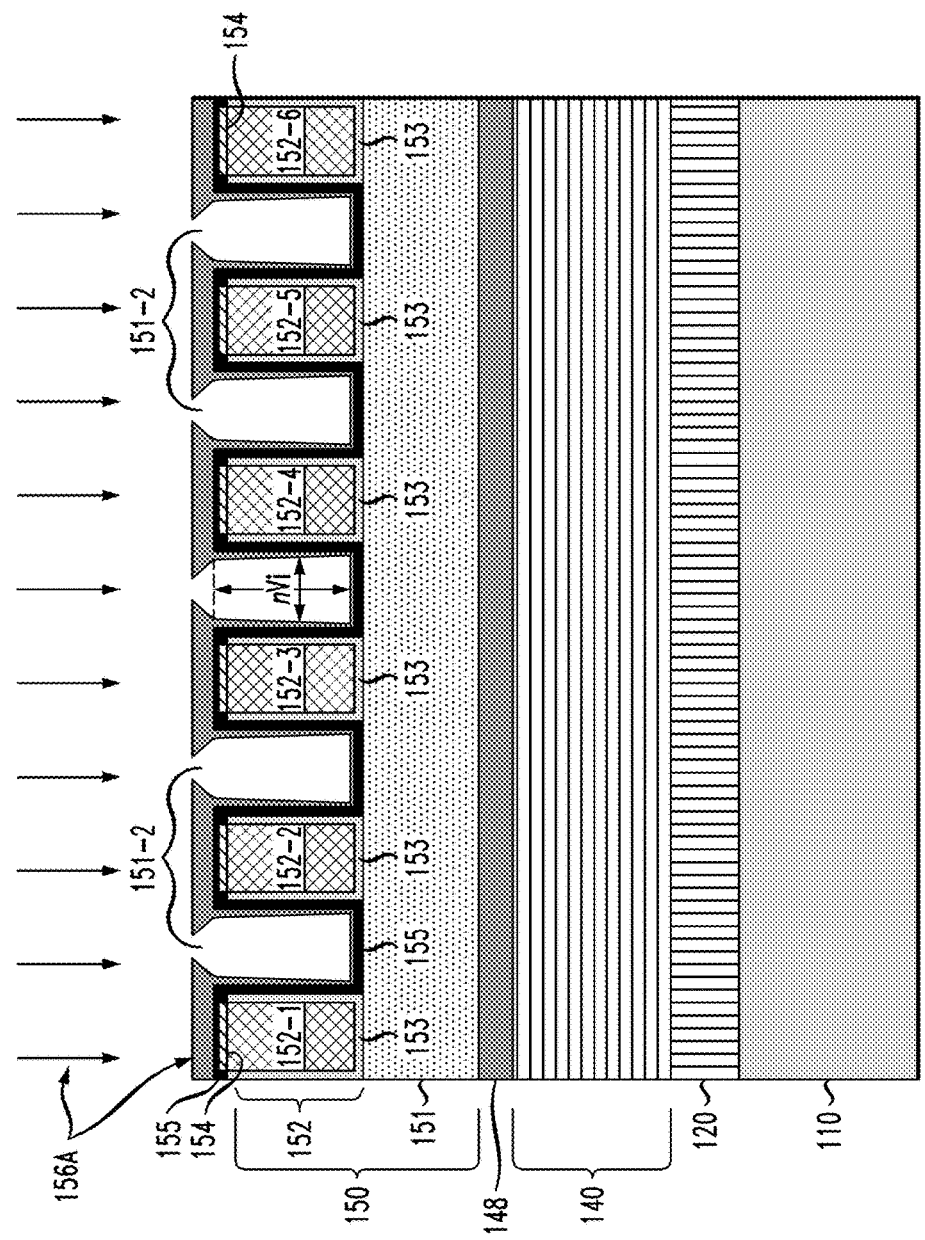

A next step in the fabrication process comprises forming air gap spacers in the second interconnect level 150 using a process flow as schematically depicted in FIGS. 8, 9 and 10. In particular, FIG. 8 is cross-sectional schematic view of the semiconductor device of FIG. 7 after etching exposed portions of the ILD layer 151 to form spaces 151-2 between the metal lines 152-1, . . . , 152-6, according to an embodiment of the invention. In one embodiment, any suitable masking (e.g., photoresist mask) and etching technique (e.g., RIE (reactive ion etch)) can be used to recess portions of the ILD layer 151 and form the spaces 151-2, as shown in FIG. 8. For example, in one embodiment, a dry etch technique using a fluorine-based etchant can be used to etch away the dielectric material of the ILD layer 151 to form the spaces 151-2. In one embodiment, the spaces 151-2 are formed such that the recessed surface of the ILD layer 151 is below the bottom surfaces of the metal lines 152-1, . . . , 152-6, as shown in FIG. 8. In another embodiment, the etch process can be performed such that the spaces 151-2 are recessed down to a level of the bottom surfaces of the metal wiring 152 (see FIG. 3). In regions of the metal wiring 152 where metal lines are spaced relatively far apart, the ILD layer 151 is not removed, since the interline capacitance between the widely spaced metal lines is assumed to be negligible.

A next step in the process comprises depositing a conformal layer of insulating material over the semiconductor structure of FIG. 8 to form the conformal insulating liner 155 as shown in FIG. 9. The conformal insulating liner 155 is an optional protective feature that may be formed prior to the pinch-off deposition process to provide added protection to the exposed surfaces of the ILD layer 151 and metal wiring layer 152. For example, in the example embodiment of FIG. 9, while the conformal liner layers 153 provide some protection to the sidewalls of the metal lines 152-1, . . . , 152-6, the conformal insulating liner 155 can provided added protection against oxidation of the metal lines 152-1, . . . , 152-6, when the metal lines are formed of copper and the liner layers 153 are not sufficient to prevent diffusion of oxygen into the metal lines from the air gap spacers 158 that are subsequently formed. Indeed, while the air gap spacers 158 as subsequently formed to have a near vacuum environment, there still exists some level of oxygen in the air gap spacers 158 which can lead to oxidation of the copper metal lines in instances when the liner layers 153 allow residual oxygen in the air gap spacers 158 to diffuse through the liner layers 153 to the metal lines.

Further, the conformal insulating liner 155 can be formed with one or more robust ultrathin layers of dielectric material which have desired electrical and mechanical characteristics such as low leakage, high electrical breakdown, hydrophobic, etc., and which can sustain low damage from subsequent semiconductor processing steps. For example, the conformal insulating liner 155 can be formed of a dielectric material such as SiN, SiCN, SiNO, SiCNO, SiBN, SiCBN, SiC, or other dielectric materials having desired electrical/mechanical properties as noted above. In one embodiment, the conformal insulating liner 155 is formed with a thickness in a range of about 0.5 nm to about 5 nm. The conformal insulating liner 155 can be formed of multiple conformal layers of the same or different dielectric materials, which are deposited using a cyclic deposition process. For example, in one embodiment, the conformal insulating liner 155 can be formed of multiple thin conformal layers of SiN (e.g., 0.1 nm-0.2 nm thick SiN layers) which are sequentially deposited to form a SiN liner layer that has a total desired thickness.

As shown in FIG. 9, after formation of the conformal insulating liner 155, the spaces 151-2 between the metal lines of the metal wiring layer 152 are shown to have an initial volume Vi. In particular, in one embodiment where the conformal insulating liner 155 is formed, the volume Vi is defined by the sidewall and bottom surfaces of the conformal insulating liner 155 and a dashed line L that denotes an upper surface of the conformal insulating liner 155 on the metal wiring layer 152. In another embodiment of the invention, when the conformal insulating liner 155 is not formed, the initial volume Vi would be defined by the exposed surfaces of the liner layers 153, the recessed surface of the ILD layer 151, and an upper surface of the metal lines of the metal wiring layer 152. As discussed below, a significant portion of the initial volume Vi remains in the spaces 151-2 between the metal lines, after formation of the air gap spacers 158 using a pinch-off deposition process according to an embodiment of the invention.

A next step in the fabrication process comprises depositing dielectric material over the semiconductor structure of FIG. 9 using a pinch-off deposition process to form the air gap spacers 158 in the spacer 151-2 between the metal lines of the metal wiring layer 152. For example, FIG. 10 schematically illustrates a process of depositing a layer of dielectric material 156A using a non-conformal deposition process (e.g., PECVD or PVD) to cause pinch-off regions to begin forming in the deposited dielectric material 156A over the spaces 151-2 between the metal lines of the metal wiring layer 152, according to an embodiment of the invention. FIG. 1A illustrates the semiconductor device 100 at the completion of the pinch-off deposition process in which the dielectric capping layer 156 is formed with pinch-off regions 156-1 in the dielectric capping layer and air gap spacers 158 formed in the spaces 151-2 between the metal lines of the metal wiring layer 152.

In accordance with embodiments of the invention, the structural characteristics (e.g., size, shape, volume, etc.) of the air gap spacers that are formed by pinch-off deposition can be controlled, for example, based on (i) the type of dielectric material(s) that are used to form the dielectric capping layer 156, and/or (ii) the deposition process and associated deposition parameters (e.g., gas flow rate, RF power, pressure, deposition rate, etc.) that are used to perform the pinch-off deposition. For example, in one embodiment of the invention, the capping layer 158 is formed by PECVD deposition of a low-k dielectric material (e.g., k in a range of about 2.0 to about 5.0). Such low-k dielectric material includes, but is not limited to, SiCOH, porous p-SiCOH, SiCN, carbon-rich SiCNH, p-SiCNH, SiN, SiC, etc. A SiCOH dielectric material has a dielectric constant k=2.7, and a porous SiCOH material has a dielectric constant of about 2.3-2.4. In one example embodiment of the invention, a pinch-off deposition process is implemented by depositing a SiCN dielectric film via a plasma CVD deposition process using an industrial parallel plate single wafer 300 mm CVD reactor with the following deposition parameters: Gas [Trimethyl Silane (200-500 standard cubic centimeter per minute (sccm)) and Ammonia (300-800 sccm)]; RF power [300-600 Watts]; Pressure [2-6 Torr]; and deposition rate [0.5-5 nm/sec].

Furthermore, the level of conformality of the PECVD deposited dielectric material can be controlled to achieve "pinch-off" of the dielectric capping layer either above the surface of adjacent metal lines or below the surface of adjacent metal lines. The term "level of conformality" of an insulating/dielectric film deposited over a trench with an aspect ratio R of 2 (wherein R=trench depth/trench opening) is defined herein as a ratio of the thickness of the insulating/dielectric film as deposited on a sidewall at the middle of the trench location divided by the thickness of the insulating/dielectric film at the top of the trench location. For example, a 33% level of conformality of an insulating/dielectric film with thickness of 3 nm deposited over a trench structure with an opening of 12 nm and a depth of 24 nm depth (aspect ratio 2) should have about 1 nm in thickness on the sidewall in the middle of the trench and 3 nm on top of the trench (level of conformality=1 nm/3 nm~33%).

For example, for a level of conformality that is about 40% and less, the "pinch-off" regions 156-1 as shown in FIG. 1A are formed in the dielectric capping layer 156 above the metal lines of the metal wiring layer 152. This results in the formation of the air gap spacers 158 which extend above the metal lines of the metal wiring layer 152. On the other hand, for a level of conformality which is greater than about 40%, the "pinch-off" regions would be formed in the dielectric capping layer below the upper surface of the metal lines of the metal wiring layer 152. This would result in the formation of air gap spacers which do not extend above the metal lines of the metal wiring layer 152.

Depending on the given application and the dimensions of the air gap/air spacer structures, a target level of conformality of the PECVD deposited dielectric material can be achieved by adjusting the deposition process parameters. For example, for PECVD dielectric materials such as SiN, SiCN, SiCOH, porous p-SiCOH, and other ULK dielectric materials, a lower level of conformality can be obtained by increasing the RF power, increasing the pressure and/or increasing the deposition rate (e.g., increase flow rate of precursor materials). As the level of conformality decreases, the "pinch-off" regions are formed above the metal lines with minimal deposition of the dielectric material on the exposed sidewall and bottom surfaces within the spaces 151-2, resulting in the formation of large, voluminous air gap spacers 158 which extend above the metal lines of the metal wiring layer 152, as shown in FIGS. 1A and 3, for example.

It is to be noted that experimental BEOL test structures such as shown in FIGS. 1A and 3 have been fabricated in which non-conformal capping layers (conformality less than 40%) comprising ULK materials (e.g., SiCOH, porous p-SiCOH) have been formed using "pinch-off" deposition methods discussed herein to obtain large, voluminous air gap spacers between closely spaced meta lines, wherein the air gap spacers extend above the metal lines, as shown in FIGS. 1A and 3. Moreover, experimental results have shown that pinch-off deposition of such non-conformal capping layers results in very little deposition of dielectric material on the sidewalls and bottom surfaces of the air spaces between the metal lines. In particular, assuming that the spaces 151-2 between the metal lines have an initial volume Vi prior to formation of the capping layer (as shown in FIG. 9), the experimental BEOL test structures have been fabricated in which a resulting volume of about nVi (wherein n is in a range of about 0.70 to nearly 1.0) has been achieved after forming the air gap spacers using a non-conformal pinch-off deposition process as described herein.

The dielectric constant of air is about unity, which is much less than the dielectric constant of the dielectric materials that are used to form the conformal insulating liner 155 and the dielectric capping layer 156. In this regard, the ability to tightly control and minimize the amount of dielectric material that is deposited within the spaces 151-2 between adjacent metal lines of the metal wiring layer 152 using techniques as discussed herein enables optimization of the electrical performance of BEOL structures by reducing the effective dielectric constant (and thus the parasitic capacitance) between adjacent metal lines of the metal wiring layer 152. Moreover, the ability to perform pinch-off deposition using ULK dielectric materials to form a low-k dielectric capping layer 156 and large voluminous air gap spacers 158, results in an overall decrease in the effective dielectric constant (and thus reduced parasitic capacitance) of the BEOL structure.

While exemplary embodiments of the invention discussed above illustrate the formation of air gap spacers as part of BEOL structures, similar techniques can be applied to form air gap spacers as part of FEOL/MOL structures to reduce parasitic coupling between adjacent FEOL/MOL structures. For example, air gap spacers can be formed between MOL device contacts and metallic gate structures of vertical transistor devices in an FEOL/MOL structure using techniques as will be discussed now in further detail with reference to FIGS. 11-19.

Figure 11:
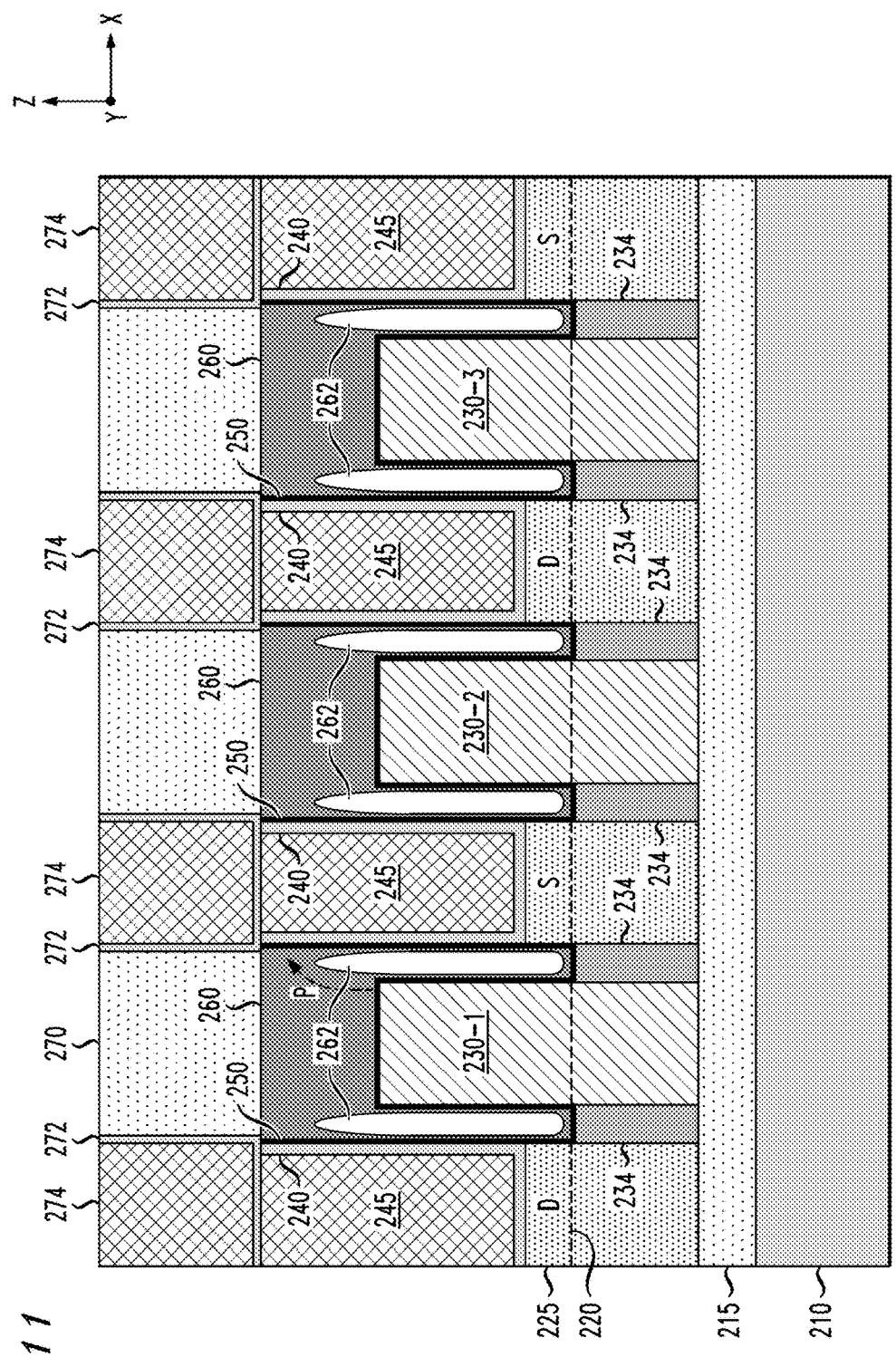
FIG. 11 is a cross-sectional schematic side view of a semiconductor device comprising air gap spacers that are integrally formed within a FEOL/MOL structure of the semiconductor device, according to another embodiment of the invention.

FIG. 11 is a cross-sectional schematic side view of a semiconductor device comprising air gap spacers that are integrally formed within a FEOL/MOL structure of the semiconductor device, according to another embodiment of the invention. In particular, FIG. 11 schematically illustrates a semiconductor device 200 comprising a substrate 210/215 which includes a bulk substrate layer 210 and an insulating layer 215 (e.g., a buried oxide layer of an SOI substrate), and a plurality of vertical transistor structures M1, M2, M3 (see FIG. 12) formed on the substrate 210/215. The vertical transistor structures M1, M2, M3 have a standard structural framework comprising a semiconductor fin 220 (which extends along the substrate in an X direction), epitaxially grown source (S)/drain (D) regions 225, and respective metal gate structures 230-1, 230-2, and 230-3. The semiconductor fin 220 serves as a vertical channel for the vertical transistor structures M1. M2, M3 in regions of the semiconductor fin 220 that are surrounded by the respective metal gate structures 230-1, 230-2, 230-3. The semiconductor fin 220 can be formed by etching/patterning an active silicon layer that is formed on top of the insulating layer 215 (e.g., an SOI layer of an SOI substrate). The semiconductor fin 220 is not specifically shown in FIG. 11, but an upper surface of the semiconductor fin 220 is depicted by the dashed line in FIG. 11 (i.e., channel portions of the semiconductor fin 220 are covered by the gate structures 230-1, 230-2 and 230-3, and portions of the semiconductor fin 220 extending from the gate structures are encapsulated in epitaxial material that grown on the exposed surfaces of the semiconductor fin 220).

In one embodiment, the metal gate structures 230-1, 230-2, and 230-3 each comprise a conformal high-k metal gate stack structure formed on a vertical sidewall and upper surface of the semiconductor fin 220, and a gate electrode formed over the high-k metal gate stack structure. Each conformal high-k metal gate stack structure comprises a conformal layer of gate dielectric material (e.g., high-k dielectric material such as $HfO_2$, $Al_2O_3$, etc.) formed on the sidewall and upper surface of the semiconductor fin 220, and a conformal layer of metallic work function metal material (e.g., Zr, W, Ta, Hf, Ti, Al, Ru, Pa, TaN, TiN, etc.) formed on the conformal layer of gate dielectric material. The gate electrode material that is formed on the high-k metal gate stack structure comprises a low-resistance conductive material including, but not limited to tungsten, aluminum, or any metallic or conductive material that is commonly used to form gate electrode structures.

The epitaxial source (S)/drain (D) regions 225 include epitaxial semiconductor material (e.g., SiGe, III-V compound semiconductor material, etc.) that is epitaxially grown on exposed portions of the semiconductor fin structures 220 which extend out from the metal gate structures 230-1, 230-2, 230-3. A plurality of MOL device contacts 240/245 are formed as part of a MOL layer of the semiconductor device 200 to provide vertical contacts to the source/drain regions 225. Each MOL device contact 240/245 comprises a liner/barrier layer 240 and a conductive via 245.

As further shown in FIG. 11, the metal gate structures 230-1, 230-2, 230-3 are electrically insulated from the MOL contacts 240/245 and other surrounding structures by insulating material layers 234, 250, 260, and air gap spacers 262. The insulating material layers include lower sidewall spacers 234, conformal insulating liners 250, and dielectric capping layers 260. The lower sidewall spacers 234 electrically insulate the metal gate structures 230-1, 230-2, 230-3 from the adjacent source/drain regions 223. The conformal insulating liners 250 (which are similar in composition and function as the conformal insulating liner 155 of the BEOL structure, FIG. 1A) conformally cover the sidewall surfaces of the MOL device contacts 240/245 and the metal gate structures 230-1, 230-2, 230-3. The conformal insulating liners 250 are optional features that can be formed to protect the MOL device contacts 240/245 and the metal gate structures 230-1, 230-2, 230-3 from potential structural damage or contamination which can result from subsequent processing steps and environmental conditions.

In accordance with embodiments of the invention, the dielectric capping layers 260 are formed by depositing a low-k dielectric material using a pinch-off deposition process to encapsulate the upper regions of the metal gate structures 230-1, 230-2, 230-3 with low-k dielectric material, and to form the air gap spacers 262 between the metal gate structures and MOL device contacts. A process flow for fabricating the air gap spacers 262 will be discussed in further detail below. As shown in FIG. 11, the air gap spacers 262 are relatively large and voluminous, and vertically extend above the metal gate structures 230-1, 230-2, 230-3. For similar reasons as discussed above with regard to the BEOL air gap spacers 158 shown in FIG. 2A, the size and shape of the FEOL/MOL air gap spacers 262 shown in FIG. 11 provide improved TDDB reliability, as well as reduced capacitive coupling between the MOL device contacts and metal gate structures.

For example, the large voluminous air gap spacers 262 reduce the effective dielectric constant in the space between the metal gate structures 230-1, 230-2, 230-3 and the MOL device contacts 240/245. In addition, since the air gap spacers 262 extend above the metal gate structures 230-1, 230-2, 230-3, as shown in FIG. 11, there is a relatively long diffusion/conducting path P between the critical interfaces of the metal gate structures 230-1, 230-2, 230-3 (the critical interfaces being an interface between the dielectric capping layers 260 and the upper surfaces of the metal gate structures 230-1, 230-2, 230-3) and the adjacent MOL device contacts 240/245. As such, the air gap spacers 262 in FIG. 11 serve to increase the TDDB reliability of the FEOL/MOL semiconductor structure.

FIG. 11 further illustrates a first interconnect level of a BEOL structure formed over the FEOL/MOL layers, wherein the first interconnect level comprises an ILD layer 270, and a plurality of metal lines 272/274 formed in the ILD layer 270 in electrical contact with respective MOL device contacts 240/245. The metal lines 272/274 are formed by etching openings (e.g., trenches or vias) in the ILD layer 270, lining the openings with barrier liner layers 272 and filling the openings with metallic material 274 such as copper, using known techniques.

Figure 12:
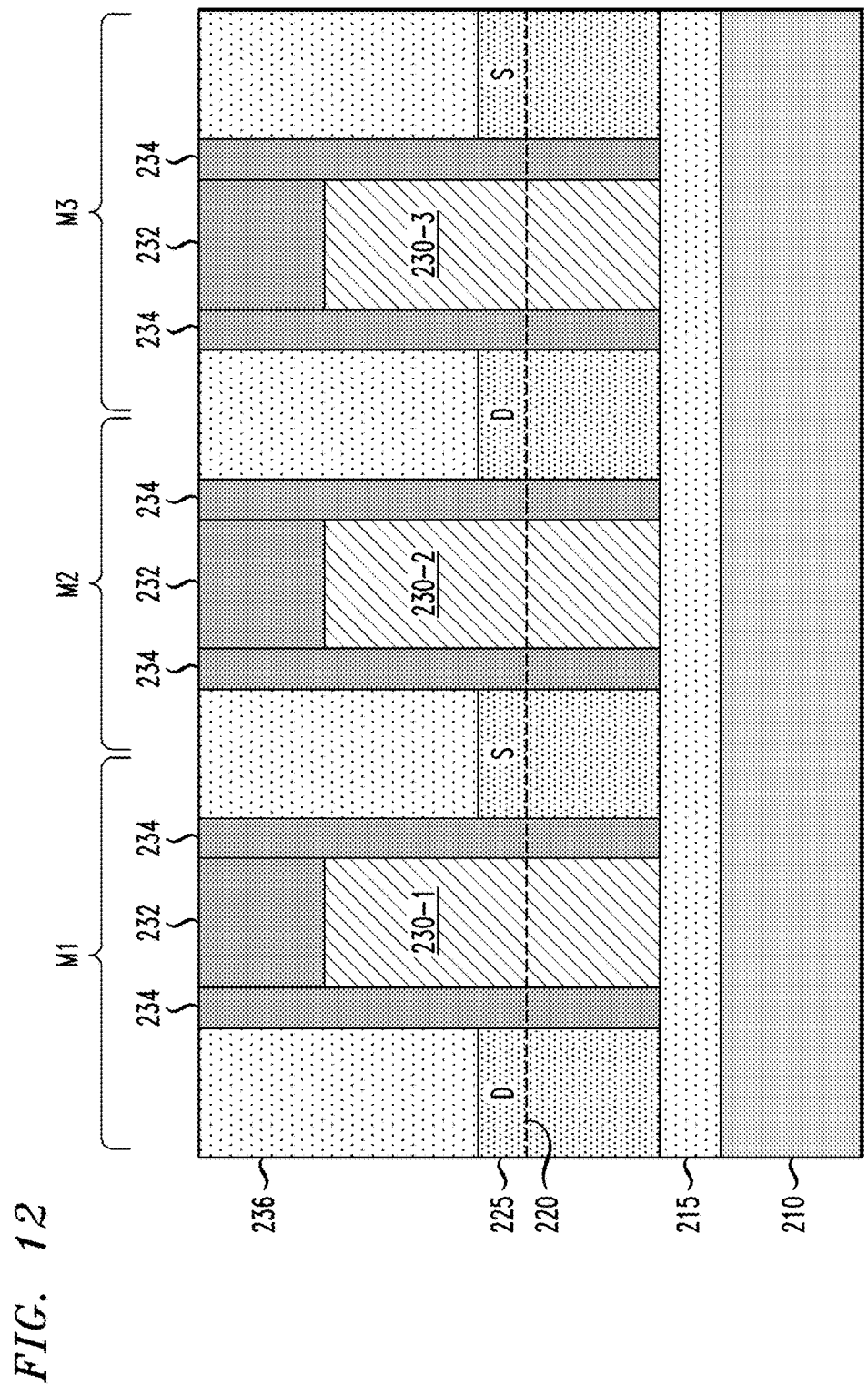

A process flow for fabricating the semiconductor device 200 of FIG. 11 will now be discussed in further detail with reference to FIGS. 12 through 19, which schematically illustrate the semiconductor device 200 at various stages of fabrication. To begin, FIG. 12 is cross-sectional schematic view of the semiconductor device 200 at an intermediate stage of fabrication in which vertical transistor structures M1, M2 and M3 are formed on the semiconductor substrate 210/215. In one embodiment, the substrate 210/215 comprises a SOI (silicon on insulator) substrate, wherein the base substrate 210 is formed of silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. The insulating layer 215 (e.g., oxide layer) is disposed between the base semiconductor substrate 210 and an active semiconductor layer (e.g., active silicon layer), wherein the active semiconductor layer is patterned using known methods to fabricate the semiconductor fin structure 220. Moreover, the epitaxial source/drain regions 225 can be epitaxially grown on exposed portions of the semiconductor fin structure 220 using know methods.

As further shown in FIG. 12, the metal gate structures 230-1, 230-2 and 230-3 are encapsulated in insulating/dielectric material structures including insulating capping layers 232, and sidewall spacers 234. The capping layers 232 and sidewall spacers 234 are fabricated using known techniques and insulating materials (e.g., SiN). The metal gate structures 230-1, 230-2, and 230-3 can be formed, for example, by a RMG (replacement metal gate) process in which dummy gate structures are initially formed, and then replaced with the metal gate structures 230-1, 230-2, 230-3 after formation of the epitaxial source/drain regions 225, but prior to formation of the MOL device contacts. In the embodiment of FIG. 12, it is assumed that an RMG process has been completed resulting in the formation of the metal gate structures 230-1, 230-2, 230-3, and that a PMD (pre-metal dielectric) layer 236 has been deposited and planarized, resulting in the structure shown in FIG. 12.

The PMD layer 236 is formed by depositing a layer of dielectric material over the surface of the semiconductor device, and then planarizing the dielectric material down to the upper surface of the capping layers 232. The PMD layer 236 may be formed with any suitable insulating/dielectric materials such as, for example, silicon oxide, silicon nitride, hydrogenated silicon carbon oxide, silicon based low-k dielectrics, porous dielectrics, or organic dielectrics including porous organic dielectrics, etc. The PMD layer 236 may be formed using known deposition techniques, such as, for example, ALD, CVD, PECVD, spin on deposition, or PVD, followed by a standard planarization process (e.g., CMP).

Figure 13:
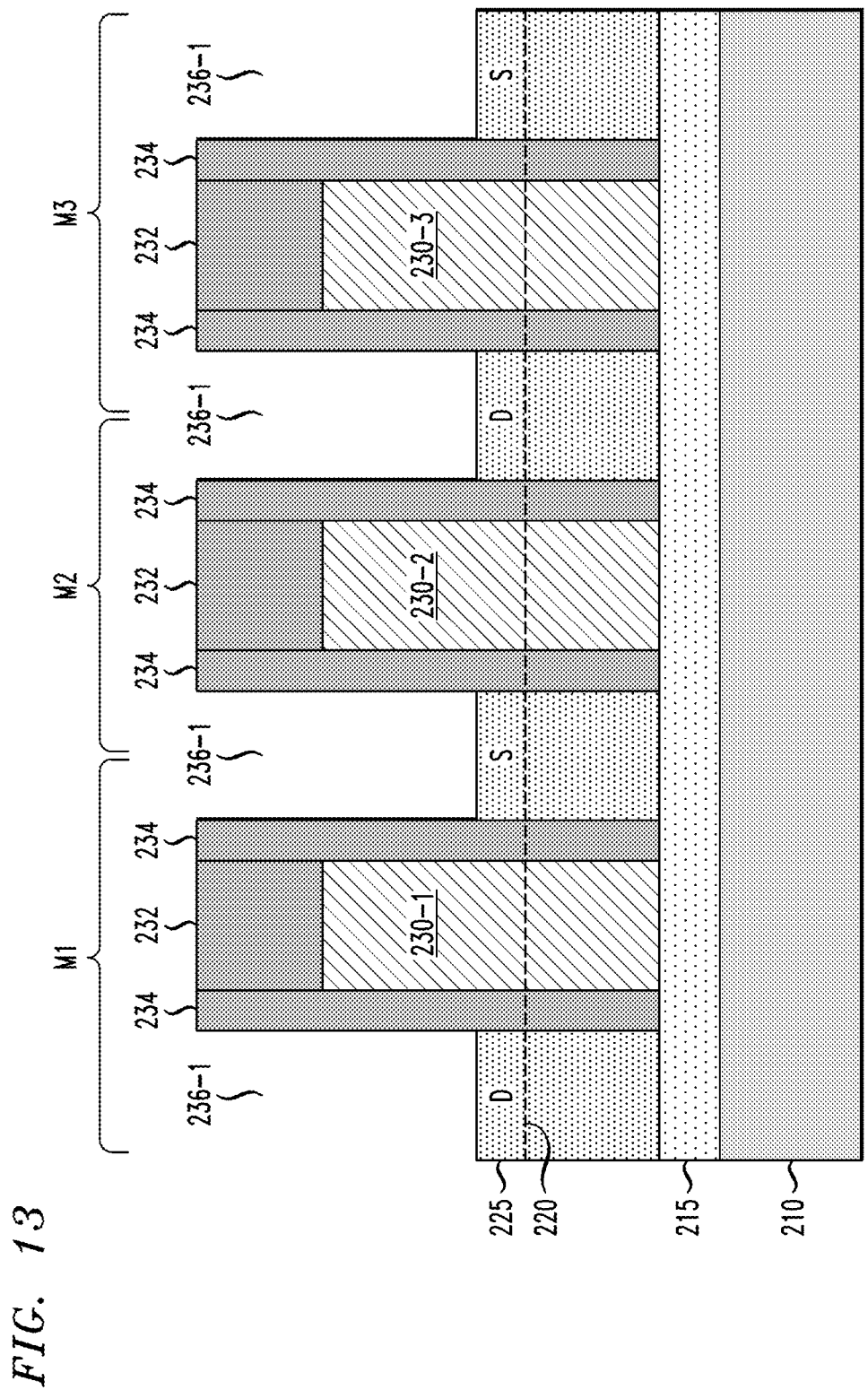
Figure 14:
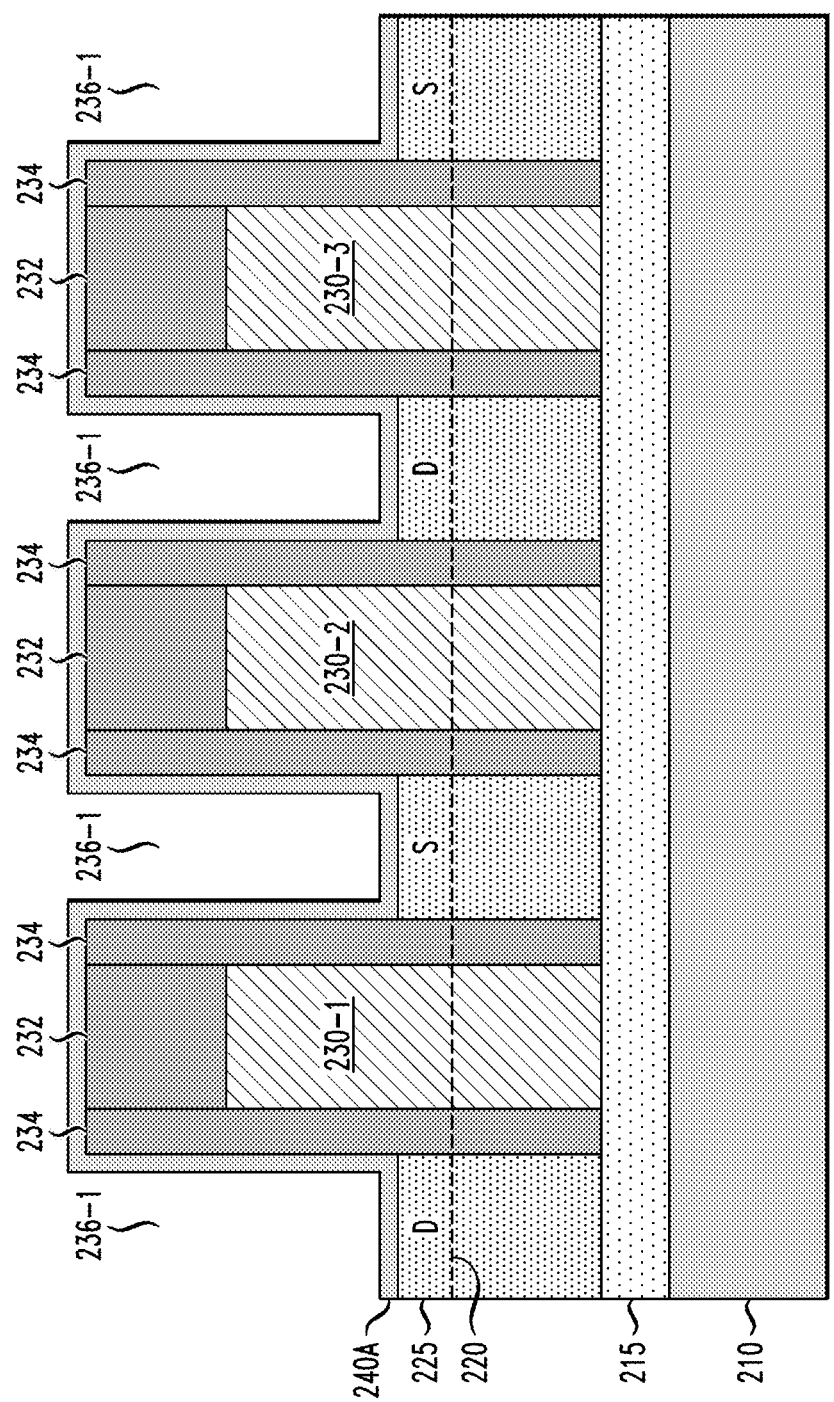
Figure 15:
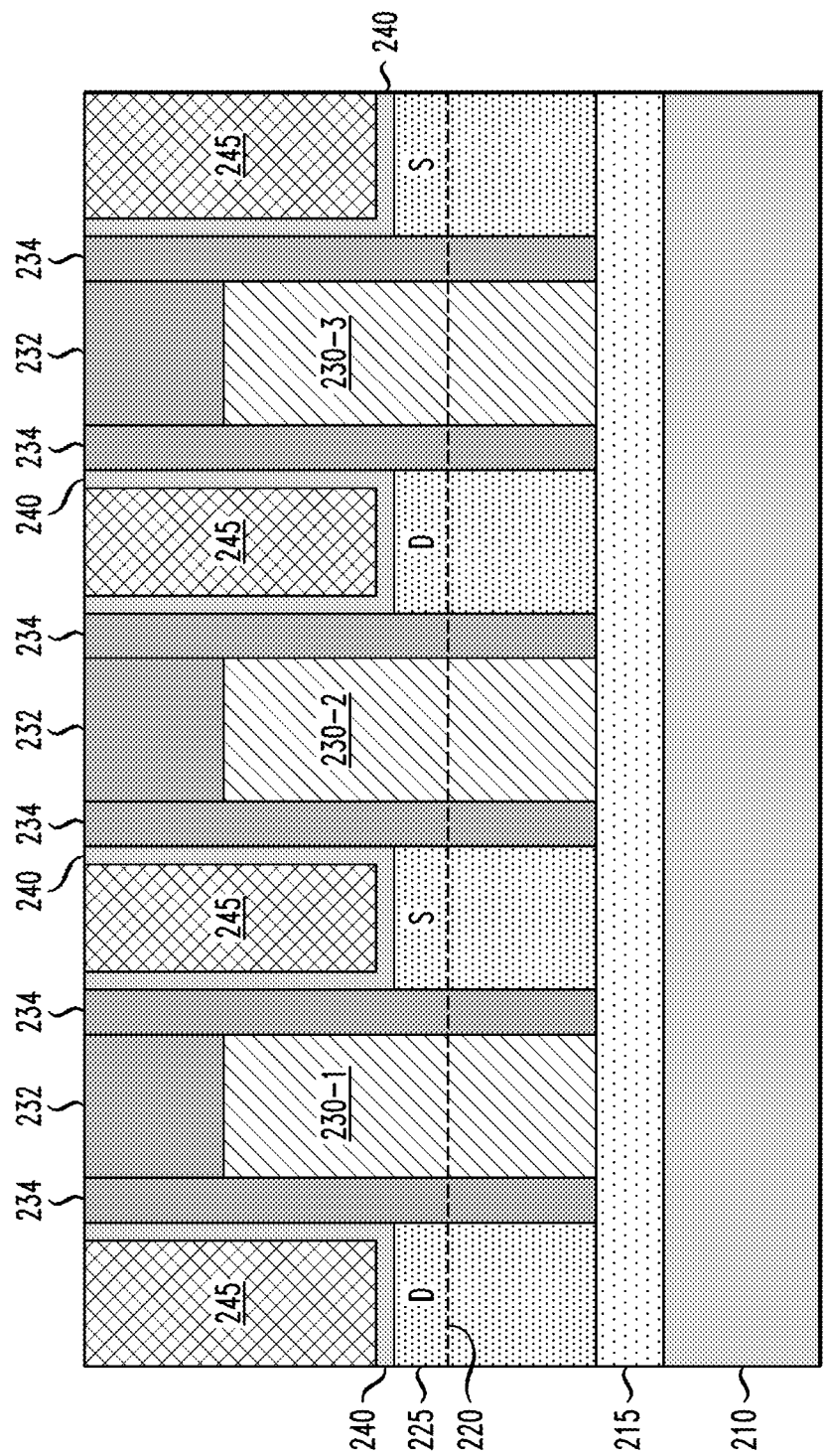

A next process module includes forming the MOL device contacts using a process flow as schematically illustrated in FIGS. 13, 14 and 15. In particular, FIG. 13 is cross-sectional schematic side view of the semiconductor device of FIG. 12 after patterning the PMD layer 236 to form contact openings 236-1 between the gate structures 230-1, 230-2, 230-3 of the vertical transistor structures M1, M2, M3 down to the source/drain regions 225. The contact openings 236-1 can be formed using known etching techniques and etching chemistries to etch the material of the PMD layer 236 selective to the insulating material of the capping layers 232 and sidewall spacers 234.

Next, FIG. 14 is cross-sectional schematic side view of the semiconductor device of FIG. 13 after depositing a conformal liner layer 240A over the surface of the semiconductor device. The conformal liner layer 240A may include a material such as TaN, etc., which serves as a barrier diffusion layer and/or adhesion layer for the metallic material that is used to fill the openings 236-1 and form the MOL device contacts. Next, FIG. 15 is a cross-sectional schematic side view of the semiconductor device of FIG. 14, after depositing a layer of metallic material to fill the contact openings 236-1 between the metal gate structures 230-1, 230-2, 230-3 with conductive material 245 and planarizing the surface of the semiconductor device down to the gate capping layers 232 to remove the overburden liner and conductive materials, and thereby form the MOL device contacts 240/245. The conductive material 245 may comprise copper, tungsten, cobalt, aluminum, or other conductive materials that are suitable for use in forming vertical MOL device contacts to the source/drain regions and gate electrodes.

While not specifically shown in FIG. 15, MOL gate contacts can be formed in openings that are formed through the PMD layer 236 and capping layers 232 down to an upper surface of the metal gate structures 230-1, 230-2, and 230-3. It is to be understood that the metal gate structures 230-1, 230-2, 230-3 extend in the Y-Y direction (in and out of the plane of the drawing sheet, based on the Cartesian coordinate system shown in FIG. 11) and, therefore, the MOL gate contacts can be formed in the PMD layer 236 in alignment with the extended end portions of the metal gate structures 230-1, 230-2, 230-3, as is understood by one of ordinary skill in the art.

Figure 16:
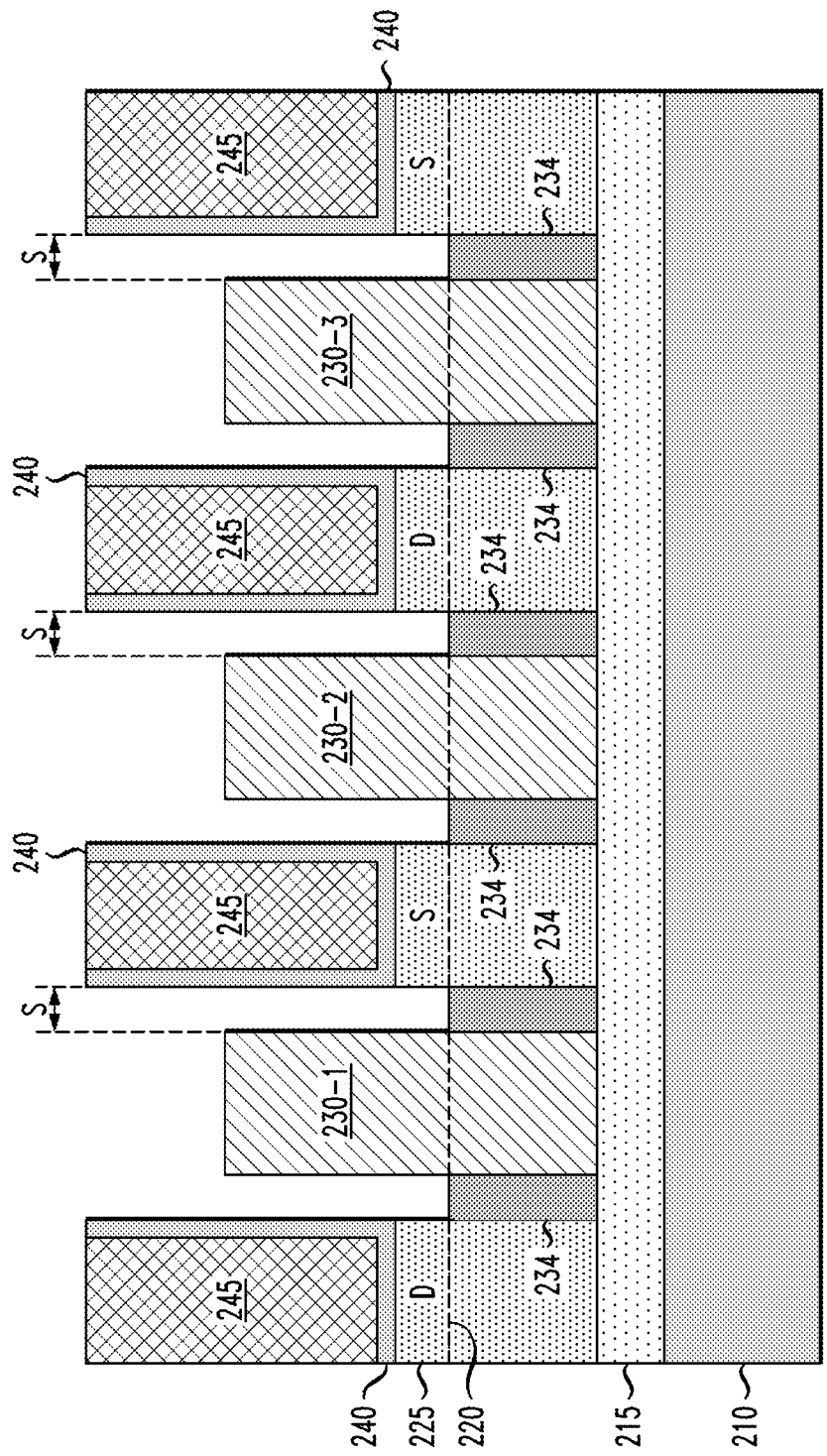

Following formation of the MOL device contacts, a next process module includes forming air gap spacers between the metal gate structures and the MOL device contacts, using a process flow as schematically illustrated in FIGS. 16-19. An initial step in this process includes etching the gate capping layers 232 and sidewall spacers 234. In particular, FIG. 16 is a cross-sectional side view of the semiconductor device of FIG. 15 after etching away the gate capping layers 232 and recessing the sidewall spacers 234 down to an upper surface of the semiconductor fin structure 220, thereby forming narrow spaces S between the sidewalls of the metal gate structures 230-1, 230-2, 230-3 and adjacent MOL device contacts 240/245. While the example embodiment of FIG. 16 shows that the gate capping layers 232 are completely etched away, in an alternate embodiment, the etch process can be implemented such that a thin layer of the etched gate capping layers 232 remains on the top surfaces of the metal gate structures 230-1, 230-2, 230-3.

Figure 17:
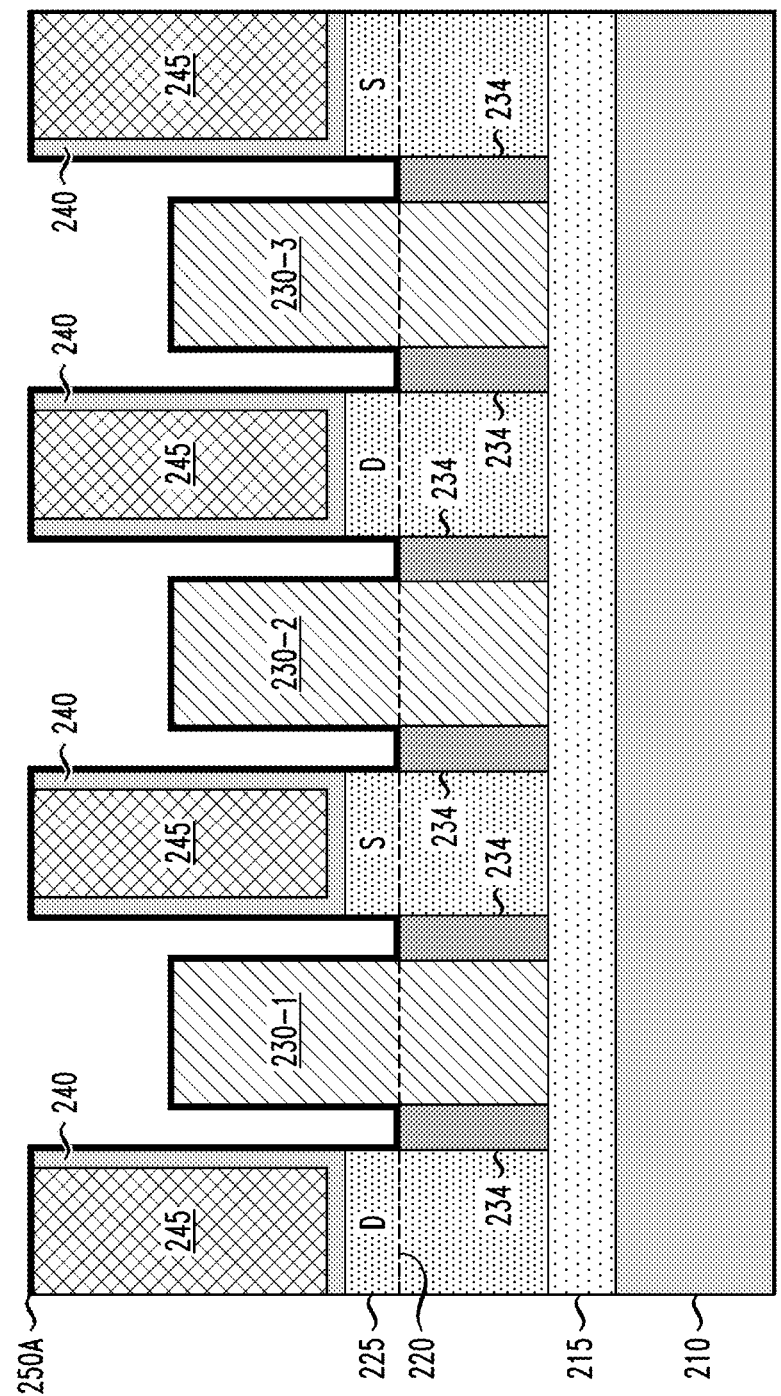

Next, FIG. 17 is a cross-sectional schematic side view of the semiconductor device of FIG. 16 after depositing a conformal layer of insulating material 250A to form an insulating liner on the exposed surfaces of the metal gate structures 230-1, 230-2, 230-3, and the MOL device contacts 240/245. The conformal insulating liner layer 250A is an optional protective feature that may be formed prior to the pinch-off deposition process to provide added protection to the exposed surfaces of the metal gate structures 230-1, 230-2, 230-3, and the MOL device contacts 240/245, for the same or similar reasons as discussed above.

Further, the conformal insulating liner layer 250A can be formed of one or more robust ultrathin layers of dielectric material which have desired electrical and mechanical characteristics such as low leakage, high electrical breakdown, hydrophobic, etc., and which can sustain low damage from subsequent semiconductor processing steps. For example, the conformal insulating liner layer 250A can be formed of a dielectric material such as SiN, SiCN, SiNO, SiCNO, SiC or other dielectric materials having desired electrical/mechanical properties as noted above. In one embodiment, when the spacing S (FIG. 16) is in a range of about 4 nm to about 15 nm, the conformal insulating liner layer 250A is formed with a thickness in a range of about 1.0 nm to about 2 nm, thereby reducing the spacing S by about 2 nm, to about 4 nm by virtue of the liner layer 250A on the sidewalls of the adjacent structures.

Similar to the BEOL embodiments discussed above, the conformal insulating liner layer 250A can be formed of multiple conformal layers of the same or different dielectric materials, which are deposited using a cyclic deposition process. For example, in one embodiment, the conformal insulating liner layer 250A can be formed of multiple thin conformal layers of SiN which are sequentially deposited to form a SiN liner layer that has a total desired thickness (e.g., using a plasma CVD or CVD process with Silane and NH3 to cyclically deposit 0.1 nm-0.2 nm thick SiN layers).

Figure 18:
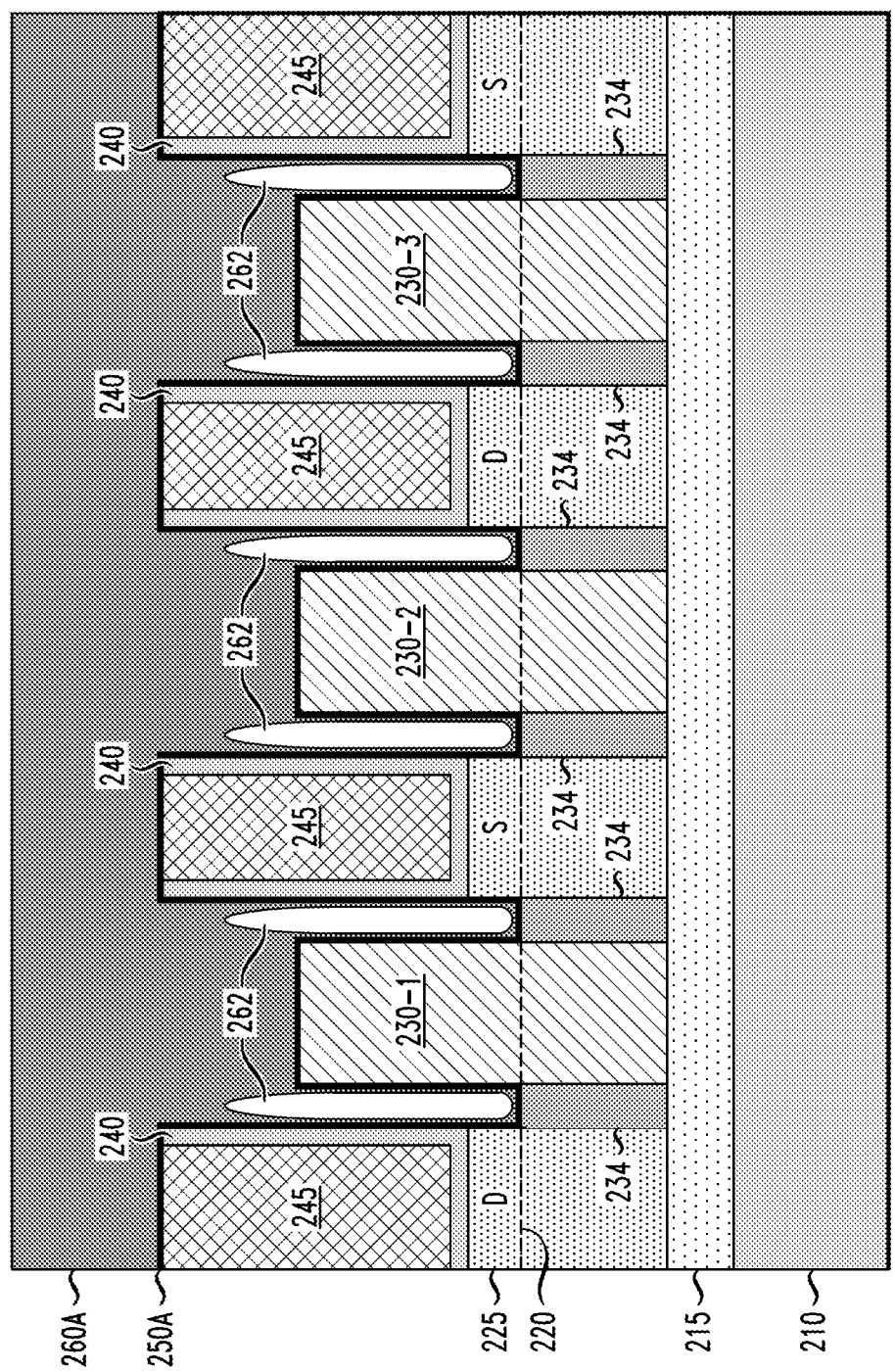

A next step in the fabrication process comprises depositing dielectric material over the semiconductor structure of FIG. 17 using a pinch-off deposition process to form air gap spacers between the metal gate structures and MOL device contacts. For example, FIG. 18 is a cross-sectional schematic side view of the semiconductor device of FIG. 17 after depositing a layer of dielectric material 260A using a non-conformal deposition process to cause pinch-off regions that form the air gap spacers 262 in the narrow spaces between the metal gate structures 230-1, 230-2, 230-3 and adjacent MOL device contacts 240/245. As discussed above, in accordance with embodiments of the invention, the structural characteristics (e.g., size, shape, volume, etc.) of the air gap spacers 262 that are formed by pinch-off deposition can be controlled, for example, based on (i) the type of dielectric material(s) that are used to form the dielectric layer 260A, and/or (ii) the deposition process and associated deposition parameters (e.g., gas flow rate, RF power, pressure, deposition rate, etc.) that are used to perform the pinch-off deposition.

For example, in one embodiment of the invention, the layer of dielectric material 260A is formed by PECVD deposition of a low-k dielectric material (e.g., k in a range of about 2.0 to about 5.0). Such low-k dielectric material includes, but is not limited to, SiCOH, porous p-SiCOH, SiCN, SiNO, carbon-rich SiCNH, p-SiCNH, SiN, SiC, etc. A SiCOH dielectric material has a dielectric constant k=2.7, and a porous SiCOH material has a dielectric constant of about 2.3-2.4. In one example embodiment of the invention, a pinch-off deposition process is implemented by depositing a SiN dielectric film via a plasma CVD deposition process using an industrial parallel plate single wafer 300 mm CVD reactor with the following deposition parameters: gas [Silane (100-500 sccm) and Ammonia (200-1000 sccm)]; RF power [200-600 Watts]; pressure [1-8 Torr]; and deposition rates [0.5-8 nm/sec].

Figure 19:
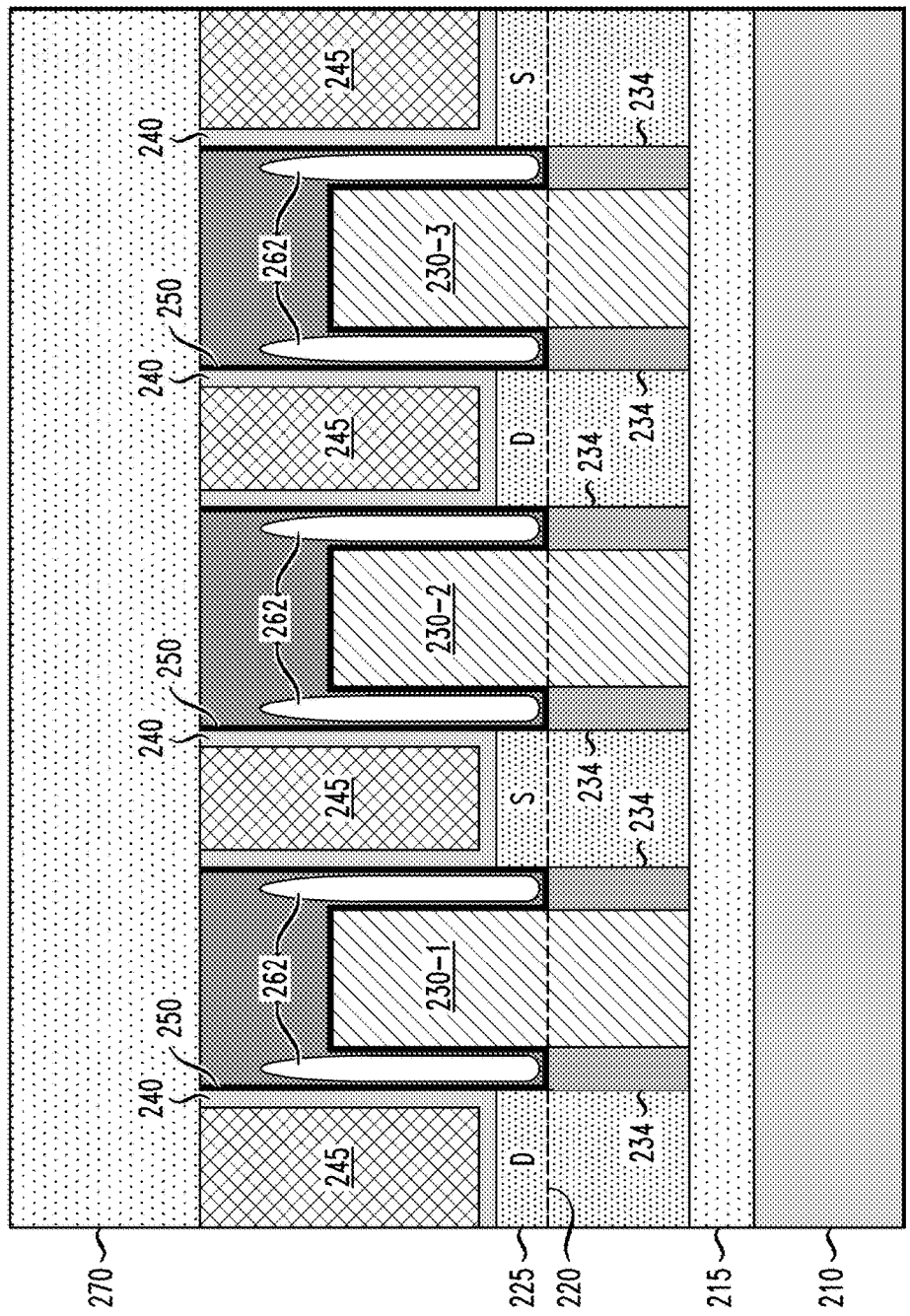

FIG. 19 is a cross-sectional schematic side view of the semiconductor device of FIG. 18 after planarizing the surface of the semiconductor device down to the MOL device contacts and depositing an ILD layer 270 as part of a first interconnect level of a BEOL structure. The semiconductor structure of FIG. 18 can be planarized using a standard CMP process, wherein the CMP process is performed to remove the overburden dielectric material 260A and portions of the insulating liner layer 250A disposed on top of the MOL device contacts, resulting in the structure shown in FIG. 19. As shown in FIG. 19, the remaining portions of the pinch-off deposited dielectric material 260A form separate dielectric capping structures 260 over the metal gate structures 230-1, 230-2, 230-3, and separate insulating liners 250. Although not specifically shown in FIGS. 11 and 19, prior to formation of the ILD layer 270, an additional capping layer can be formed on the planarized FEOL/MOL surface to insulate the conductive material 245 of the MOL device contacts from the dielectric material of the ILD layer 270.

Experimental test structures have been fabricated based on the semiconductor structure schematically illustrated in FIG. 11, wherein the conformal insulating liners 250 were formed with cyclic SiN films with thicknesses of 1 nm, 1.5 nm, 2 nm, and 3 nm, and wherein the pinch-off deposition was performed using PECVD SiCN fills and PECVD ULK films with k=2.7 and 2.4. The experimental results demonstrated that large voluminous air gap spacers (air gap spacers 262 schematically illustrated in FIG. 11) can be obtained, which extend above the metal gate structures. In addition, experimental results have demonstrated that the size, shape, volume, etc. of air gap spacers can be optimized for different applications by varying deposition process parameters or the materials used for pinch-off deposition.

It is to be understood that the methods discussed herein for fabricating air gap spacers in FEOL/MOL or BEOL layers can be incorporated within semiconductor processing flows for fabricating semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method, comprising:
   forming a first metallic structure and a second metallic structure on a substrate, wherein the first and second metallic structures are disposed adjacent to each other with insulating material disposed between the first and second metallic structures;
   etching the insulating material to form a space between the first and second metallic structures; and
   depositing a layer of dielectric material over the first and second metallic structures to form an air gap in the space between the first and second metallic structures;
   wherein a portion of the air gap extends above an upper surface of at least one of the first metallic structure and the second metallic structure;
   wherein depositing the layer of dielectric material over the first and second metallic structures comprises:
      depositing a non-conformal layer of dielectric material to form a dielectric capping layer having a pinch-off region that is aligned to the space between the first and second metallic structures;
      wherein the pinch-off region is formed in the dielectric capping layer above the upper surface of the at least one first metallic structure and second metallic structure; and
      wherein depositing the layer of dielectric material comprises depositing a non-conformal layer of silicon carbon nitride material using a plasma-enhanced chemical vapor deposition process, wherein parameters of the plasma-enhanced chemical vapor deposition process comprise (i) a gas environment comprising trimethyl silane at a flow rate in a range of 200-500 standard cubic centimeter per minute and ammonia at a flow rate in a range of 300-800 standard cubic centimeter per minute, (ii) RF power in a range of 300-600 watts, (iii) pressure in a range of 2-6 Torr, and (iv) a deposition rate in a range of 0.5-5 nanometers/second.

2. The method of claim 1, wherein the first metallic structure comprises a first metal line formed in an ILD (interlevel dielectric) layer of a BEOL (back-end-of-line) interconnect structure, and wherein the second metallic structure comprises a second metal line formed in the ILD layer of the BEOL interconnect structure.

3. The method of claim 2, wherein the portion of the air gap extends above the first metal line and above the second metal line.

4. The method of claim 1, wherein the first metallic structure comprises a device contact, and wherein the second metallic structure comprises a gate structure of a transistor.

5. The method of claim 4, wherein the device contact is taller than the gate structure, and wherein the portion of the air gap extends above the gate structure and below an upper surface of the device contact.

6. The method of claim 1, wherein depositing the non-conformal layer of dielectric material comprise setting the parameters of the plasma-enhanced chemical vapor deposition process to obtain a level of conformality of about 40% or less.

7. The method of claim 1, further comprising forming a conformal liner layer within the space between the first and second metallic structures before depositing the layer of dielectric material over the first and second metallic structures to form the air gap in the space between the first and second metallic structures.

8. The method of claim 7, wherein forming the conformal liner layer comprises depositing a plurality of conformal dielectric layers to thereby form a multi-layer liner.

9. The method of claim 7, wherein the conformal liner layer is formed of a dielectric material comprising one or more of SiN, SiCN, SiNO, SiCNO, SiBN, SiCBN, and SiC.

10. The method of claim 7, wherein the conformal liner layer comprises a thickness in a range of about 0.5 nm to about 5 nm.

11. The method of claim 1, wherein the air gap extends past an end of at least one of the first and second metallic structures.

12. A method, comprising:
   forming a fin field-effect transistor device on a substrate, the fin field-effect transistor device comprising a vertical semiconductor fin, a metallic gate structure formed over a portion of the vertical semiconductor fin, a gate encapsulation layer covering upper and sidewall surfaces of the metallic gate structure, and first and second source/drain contacts formed in contact with portions of the vertical semiconductor fin extending from the sidewall surfaces of the metallic gate structure, wherein gate encapsulation layer comprises gate sidewall spacers disposed between the metallic gate structure and the first and second source/drain contacts and a gate capping layer disposed over the upper surface of the metallic gate structure;
   etching the gate encapsulation layer to form spaces between the metallic gate structure and the first and second source/drain contacts; and
   depositing a layer of dielectric material over the fin field-effect transistor device to thereby cover the upper surface of the metallic gate structure with the dielectric material and form air gaps in the spaces between the metallic gate structure and the first and second source/drain contacts;
   wherein upper portions of the air gaps are disposed above the upper surface of the metallic gate structure and disposed below upper surfaces of the first and second source/drain contacts; and wherein bottom portions of the air gaps are disposed below bottom surfaces of the first and second source/drain contacts.

13. The method of claim 12, wherein depositing the layer of dielectric material over the fin field-effect transistor device comprises depositing a non-conformal layer of dielectric material to form a dielectric capping layer which is disposed on the upper surface of the metallic gate structure and which comprises pinch-off regions that are aligned to the spaces between the metallic gate structure and the first and second source/drain contacts.

14. The method of claim 13, wherein depositing the layer of dielectric material comprises depositing a non-conformal layer of silicon nitride material using a plasma-enhanced chemical vapor deposition process, wherein parameters of the plasma-enhanced chemical vapor deposition process comprise (i) a gas environment comprising silane at a flow rate in a range of 100-500 standard cubic centimeter per minute and ammonia at a flow rate in a range of 200-1000 standard cubic centimeter per minute, (ii) RF power in a range of 200-600 watts, (iii) pressure in a range of 1-8 Torr, and (iv) a deposition rate in a range of 0.5-8 nanometers/second.

15. The method 14, wherein depositing the non-conformal layer of dielectric material comprise setting the parameters of the plasma-enhanced chemical vapor deposition process to obtain a level of conformality of about 40% or less.

16. The method of claim 12, wherein the layer of dielectric material comprises a low-k dielectric material having a dielectric constant that is about 5.0 or less.

17. The method of claim 12, wherein the layer of dielectric material comprises at least one of SiCOH, porous p-SiCOH, SiCN, SiNO, carbon-rich SiCNH, SiC, p-SiCNH, and SiN.

18. The method of claim 12, further comprising forming a conformal liner layer over the first and second source/drain contacts and the metallic gate structure to line the sidewall surfaces in the spaces between the metallic gate structure and the first and second source/drain contacts, before depositing the layer of dielectric material form the air gaps in the spaces between the metallic gate structure and the first and second source/drain contacts.

19. The method of claim 18, wherein the spaces between the metallic gate structure and the first and second source/drain contacts have a spacing in a range of about 4 nm to about 15 nm.

20. The method of claim 18, wherein the conformal liner layer is formed with a thickness in a range of about 1.0 nm to about 2 nm.

* * * * *